United States Patent
Disbrow, Jr. et al.

(10) Patent No.: US 8,190,097 B2
(45) Date of Patent: May 29, 2012

(54) SYSTEMS, METHODS, AND COMPUTER PROGRAM PRODUCTS FOR DETERMINING PERFORMANCE OF PORTABLE ELECTRONIC DEVICES

(75) Inventors: Stanley G. Disbrow, Jr., Fuquay Varina, NC (US); Thomas J. Ambrose, Kenly, NC (US); Brett S. Delong, Garner, NC (US); Fred P. Nading, Jr., Cary, NC (US)

(73) Assignee: Sony Ericsson Mobile Communications AB, Lund (SE)

( * ) Notice: Subject to any disclaimer, the term of this patent is extended or adjusted under 35 U.S.C. 154(b) by 952 days.

(21) Appl. No.: 12/173,317

(22) Filed: Jul. 15, 2008

(65) Prior Publication Data

US 2010/0013722 A1    Jan. 21, 2010

(51) Int. Cl.
    *H04B 17/00*    (2006.01)
(52) U.S. Cl. ............... 455/67.12; 455/67.11; 455/575.5; 343/869
(58) Field of Classification Search ............... 455/67.12, 455/67.11, 575.5, 67.14, 423, 115.1, 115.2, 455/115.4, 226.1, 25, 63.4, 562.1; 343/869, 343/882, 838, 841
    See application file for complete search history.

(56) References Cited

U.S. PATENT DOCUMENTS

| | | | | |
|---|---|---|---|---|
| 4,579,882 A | * | 4/1986 | Kanbe et al. | 523/137 |
| 4,879,560 A | * | 11/1989 | McHenry | 342/165 |
| 4,962,358 A | * | 10/1990 | Svetanoff | 324/627 |
| 6,031,486 A | * | 2/2000 | Anderson et al. | 342/165 |
| 6,223,033 B1 | * | 4/2001 | Lusterman | 455/425 |
| 6,839,032 B2 | * | 1/2005 | Teshirogi et al. | 343/702 |
| 7,109,931 B2 | * | 9/2006 | Kadambi et al. | 343/703 |
| 7,228,105 B2 | * | 6/2007 | Rowell et al. | 455/67.11 |
| 7,286,961 B2 | | 10/2007 | Kildal | |
| 7,873,339 B2 | * | 1/2011 | Qi et al. | 455/226.2 |
| 7,912,463 B2 | * | 3/2011 | Jin et al. | 455/425 |
| 2003/0008620 A1 | * | 1/2003 | Rowell et al. | 455/67.1 |
| 2008/0311871 A1 | * | 12/2008 | Qi et al. | 455/226.2 |
| 2011/0014094 A1 | * | 1/2011 | Kim et al. | 422/400 |

FOREIGN PATENT DOCUMENTS

EP    1 223 432 A1    7/2002
EP    1 494 036 A1    1/2005

OTHER PUBLICATIONS

International Search Report/Written Opinion, International Application No. PCT/US2009/000507, Apr. 24, 2009, 10 pages.
Cragin, Bruce L., "Prediction of Seasonal Trends in Cellular Dropped Call Probability," IEEE International Conference on Electro/Information Technology, May 1, 2006, pp. 613-618.
Notification of Transmittal of the International Preliminary Report on Patentability; Corresponding to International Application No. PCT/US2009/000507; Date of Mailing: Jan. 12, 2010; 12 pages.

* cited by examiner

*Primary Examiner* — Minh D Dao
(74) *Attorney, Agent, or Firm* — Myers Bigel Sibley & Sajovec

(57) ABSTRACT

A link performance analysis (LPA) system is provided for multi-path radio frequency (RF) testing. The LPA system includes a shielded chamber and an antenna positioned in the chamber. A rotating turntable is positioned in the chamber and spaced apart from the antenna. A rotating screen is positioned in the chamber between the antenna and the rotating turntable. A plurality of stationary screens are spaced apart from and surrounding the rotating turntable. Related methods and computer program products are also provided.

11 Claims, 30 Drawing Sheets

| Model | Chip Set | %RIF | 850 SAML TRP | Loss + Var |
|---|---|---|---|---|
| Nokia 6010 | Nokia | .35% | | 12.5 |
| W810i | Copper | .42% | 22.2 | 12.4 |
| T637 | Carbon | .43% | 23.1 | 15.5 |
| Moto RAZR | Freescale | .44% | 25.8 | 14.9 |
| S710a | Copper | .45% | 25.7 | 15.7 |
| W300i | Copper | .47% | 22.6 | 13.4 |
| W600i | Copper | .47% | 25.8 | 15.8 |
| Z500a | Copper | .55% | 25.3 | 16.8 |
| T237 | Carbon | .73% | 24.3 | 23.8 |
| Z520a | Cobalt | .82% | 23.4 | 22.1 |
| Gisele FP* | Copper | .49% | | 17.2 |
| Alva FP* | NXP | .55% | | 18.0 |
| Bear EP* | U360 | .50% | | 16.6 |
| Moto RIZR | Freescale | | | 17.3 |

Figure 31

SYSTEMS, METHODS, AND COMPUTER PROGRAM PRODUCTS FOR DETERMINING PERFORMANCE OF PORTABLE ELECTRONIC DEVICES

FIELD OF THE INVENTION

The present invention relates to wireless networks, and, more particularly, to systems for testing performance of portable electronic devices and related methods and computer program products.

BACKGROUND OF THE INVENTION

Network providers are always looking for a way to determine how a portable electronic device will perform before the portable electronic device is provided for sale to the customers. Conventional methods of testing these devices before they are provided to the customer typically do not provide very accurate, reliable results. FIGS. 1 through 3 illustrate example conventional testing methods. Referring first to FIG. 1, portable electronic devices 190 may be tested using a testbox 110 connected to a computer 120. The testbox 110 protocol used in this method of testing may not be aligned with the service provider's network, therefore, this method may provide inaccurate results. Furthermore, testbox testing methods do not test portable electronic device antenna performance, which may be useful in providing a more accurate prediction of the portable electronic devices' real world performance.

Referring now to FIG. 2, portable electronic devices may also be tested using a conducted network, where the portable electronic device 290 is connected to the base station transceiver (BTS) 230 through an RF Cable and the BTS 230 is connected to the BSC/MSC 235. Conducted network tests also do not test portable electronic device antenna performance.

Referring now to FIG. 3, some conventional methods connect the portable electronic device 390 to the BTS 330 over the air (OTA), however, these OTA environments may be uncontrolled and, therefore, may be susceptible to unknown changing network settings and external uncontrolled influences. Accordingly, the conventional test methods discussed with respect to FIGS. 1 through 3 may not accurately predict real-world performance of the portable electronic device. Furthermore, these tests only test the functionality of the antenna of the portable electronic device in a controlled environment, which may lack real world interference. For example, conventional methods typically do not test a link between the antenna of the portable electronic device and the antenna in the base station.

SUMMARY OF THE INVENTION

Some embodiments of the present invention provide a link performance analysis (LPA) system for multi-path radio frequency (RF) testing. The LPA system includes a shielded chamber and an antenna positioned in the chamber. A rotating turntable is positioned in the chamber and spaced apart from the antenna. A rotating screen is positioned in the chamber between the antenna and the rotating turntable. A plurality of stationary screens are spaced apart from and surrounding the rotating turntable.

In further embodiments of the present invention, the chamber may be a quasi-anechoic screen room having dimensions of at least about 16 feet by about 24 feet. The antenna and the rotating turntable may be positioned about 3 meters apart and the rotating screen may be positioned half way between the antenna and the rotating turntable.

In still further embodiments of the present invention, the testing may be performed using circular polarization and the antenna may be a dual polarity wideband horn antenna that enables the circular polarization.

In some embodiments of the present invention, the rotating turntable may be configured to receive at one portable electronic device and to rotate in a circle during a test.

In further embodiments of the present invention, the rotating turntable may be configured to receive a simulated head, a simulated hand and/or at least one portable electronic device and to rotate in a circle during a test. In certain embodiments, the rotating turntable may be configured to receive at least the simulated hand having one of eight hand positions.

In still further embodiments, the rotating screen may be configured to fade a signal passing through space between the antenna and the rotating turntable.

In some embodiments of the present invention, a set of stationary corner reflector screens may be positioned behind the rotating turntable opposite the antenna. The set of stationary corner reflector screens may be positioned at a 45 degree angle from the wall and configured to reflect signals produced by the system at the rotating turntable.

In further embodiments of the present invention, the stationary reflector screens may include eight stationary reflector screens that surround the turntable and are configured to force multipath conditions in the chamber during a test.

In still further embodiments of the present invention, the LPA system may be coupled to base stations in a live wireless network during a test.

Some embodiments of the present invention provide methods and computer program products for predicting radio frequency (RF) performance in a wireless network. Uplink and downlink data about a connection between a portable electronic device and a base station is collected using a link performance analysis (LPA) system. A drop call percentage caused by the portable electronic device is predicted based on the collected uplink and downlink data.

In further embodiments of the present invention, additional uplink and downlink data may be collected about the connection using the LPA system. The predicted drop call percentage may be refined based on the collected additional uplink and downlink data.

In still further embodiments of the present invention, measurements may be obtained on at least one frequency band in the wireless network using the LPA system. A total average loss may be calculated for each of the at least one frequency bands based on the obtained measurements. In certain embodiments, the drop call percentage caused by the portable electronic device may be predicted based on the calculated total average loss for each of the at least one frequency bands.

In some embodiments of the present invention, the measurements may be obtained on four GSM frequency bands in the wireless network using the LPA system. The four GSM frequency bands include 850, 900, 1800 and 1900 MHz.

BRIEF DESCRIPTION OF THE DRAWINGS

FIG. 31 is a table illustrating test results obtained using an LPA system in accordance with some embodiments of the present invention.

DETAILED DESCRIPTION OF EMBODIMENTS OF THE INVENTION

Figure 1:
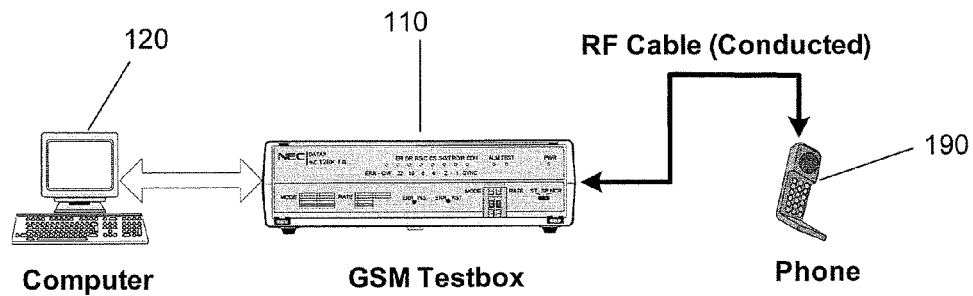
FIGS. 1 through 3 are block diagrams of various conventional performance testing systems.
Figure 2:
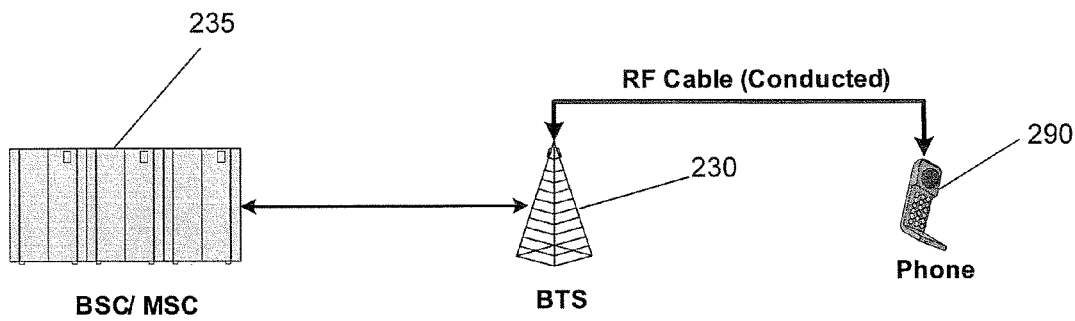
Figure 3:
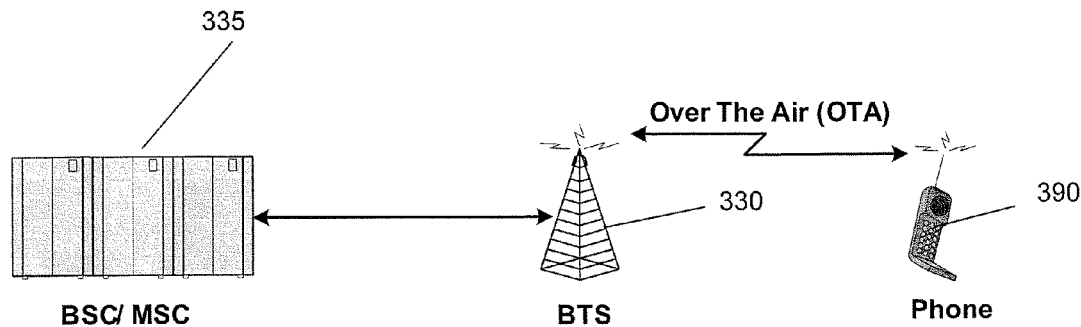

The present invention will be described more fully hereinafter with reference to the accompanying figures, in which embodiments of the invention are shown. This invention may, however, be embodied in many alternate forms and should not be construed as limited to the embodiments set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising," "includes" and/or "including" when used in this specification, specify the presence of stated features, integers, steps, operations, elements, and/or components, but do not preclude the presence or addition of one or more other features, integers, steps, operations, elements, components, and/or groups thereof. Moreover, when an element is referred to as being "responsive" or "connected" to another element, it can be directly responsive or connected to the other element, or intervening elements may be present. In contrast, when an element is referred to as being "directly responsive" or "directly connected" to another element, there are no intervening elements present. As used herein the term "and/or" includes any and all combinations of one or more of the associated listed items and may be abbreviated as"/".

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element without departing from the teachings of the disclosure. Although some of the diagrams include arrows on communication paths to show a primary direction of communication, it is to be understood that communication may occur in the opposite direction to the depicted arrows.

Example embodiments are described below with reference to block diagrams and/or flowchart illustrations of methods, systems and/or computer program products. It is understood that a block of the block diagrams and/or flowchart illustrations, and combinations of blocks in the block diagrams and/or flowchart illustrations, can be implemented by computer program instructions. These computer program instructions may be provided to a processor of a general purpose computer, special purpose computer, and/or other programmable data processing apparatus to produce a machine, such that the instructions, which execute via the processor of the computer and/or other programmable data processing apparatus, create means (functionality) and/or structure for implementing the functions/acts specified in the block diagrams and/or flowchart block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the functions/acts specified in the block diagrams and/or flowchart block or blocks.

The computer program instructions may also be loaded onto a computer or other programmable data processing apparatus to cause a series of operational steps to be performed on the computer or other programmable apparatus to produce a computer-implemented process such that the instructions which execute on the computer or other programmable apparatus provide steps for implementing the functions/acts specified in the block diagrams and/or flowchart block or blocks.

Accordingly, example embodiments may be implemented in hardware and/or in software (including firmware, resident software, micro-code, etc.). Furthermore, example embodiments may take the form of a computer program product on a computer-usable or computer-readable storage medium having computer-usable or computer-readable program code embodied in the medium for use by or in connection with an instruction execution system. In the context of this document, a computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, or device. More specific examples (a non-exhaustive list) of the computer-readable medium would include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

Computer program code for carrying out operations of data processing systems discussed herein may be written in a high-level programming language, such as Java, AJAX (Asynchronous JavaScript), C, and/or C++, for development convenience. In addition, computer program code for carrying out operations of example embodiments may also be written in other programming languages, such as, but not limited to, interpreted languages. Some modules or routines may be written in assembly language or even micro-code to enhance performance and/or memory usage. However, embodiments are not limited to a particular programming language. It will be further appreciated that the functionality of any or all of the program modules may also be implemented using discrete hardware components, one or more application specific integrated circuits (ASICs), or a programmed digital signal processor or microcontroller.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated.

As discussed above, conventional methods of testing radio frequency (RF) performance of portable electronic devices typically use either free space or SAM measurements to determine the RF performance of the portable electronic device. Typically, the result of this testing has not correlated very well with actual performance statistics measured by network operators. Accordingly, some embodiments of the present invention provide systems, methods and computer program products for testing RF performance in a faded multi-path environment, the results of which correlate relatively well with actual drop call statistics measured by network operators. Drop call statistics are the main tool used by Network Operators to grade the RF performance of a portable electronic device.

In particular, some embodiments of the present invention provide a link performance analysis (LPA) system for multi-path RF testing. Some embodiments of the LPA system include a shielded chamber; an antenna positioned in the chamber; a rotating turntable positioned in the chamber and spaced apart from the antenna; a rotating screen positioned in the chamber between the antenna and the rotating turntable; and a plurality of stationary screens spaced apart from and surrounding the rotating turntable. The LPA system may be connected to a live wireless network and enables testing of a portable electronic device such that results of this testing may actually show how the tested portable electronic device will perform under actual user conditions. Conventional solutions do not typically correlate well to actual RF performance of a portable electronic device. Accordingly, test results provided in accordance with some embodiments of the present invention may be valuable during the concept and design phase of a product to gain increased performance and acceptance by customers.

Figure 4:
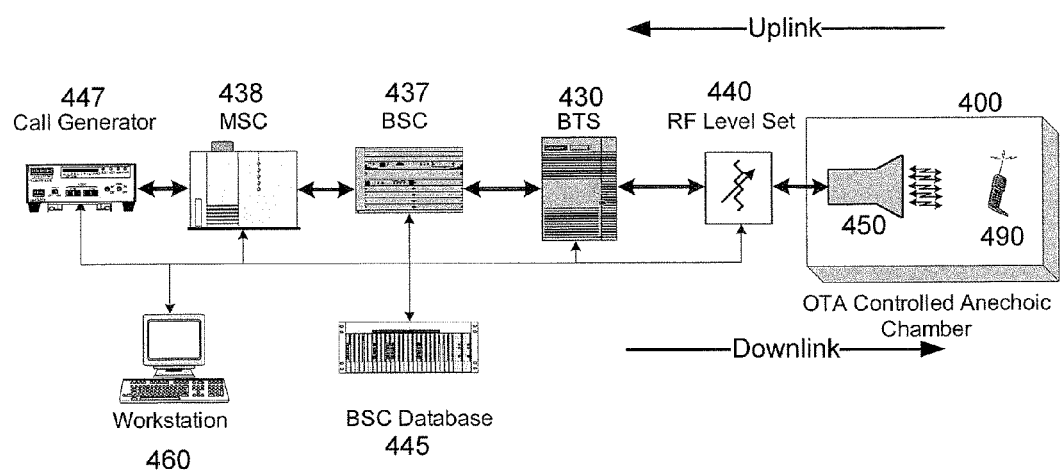
FIG. 4 is a test system including a link performance analysis (LPA) system in accordance with some embodiments of the present invention.

Some embodiments of the present invention will be discussed below with respect to FIGS. 4 through 31. Referring first to FIG. 4, a system including an LPA chamber 400 in accordance with some embodiments of the present invention will be discussed. As illustrated in FIG. 4, the LPA chamber 400 includes at least one portable electronic device 490 and an antenna 450. The LPA chamber 400 is further connected to an RF level set 440, a BTS 430, a BSC 437 coupled to BSC database 445, and MSC 438, a call generator 447 and a computer 460. It will be understood that the system set out in FIG. 4 is provided as an example and, therefore, systems in accordance with some embodiments of the present invention are not limited to the system illustrated in FIG. 4.

One or more portable electronic devices 490 may be tested. As used herein, the term "portable electronic device" includes: a cellular radiotelephone with or without a multi-line display; a Personal Communications System (PCS) terminal that combines a cellular radiotelephone with data processing, facsimile and data communications capabilities; a Personal Data Assistant (PDA) that includes a radiotelephone, pager, Internet/intranet access, Web browser, organizer, calendar and/or a global positioning system (GPS) receiver; a gaming device, an audio video player, and a conventional laptop and/or palmtop portable computer that includes a radiotelephone transceiver. Any portable electronic device capable of operating in accordance with some embodiments of the present invention may be used without departing from the scope of the present invention.

Figure 5:
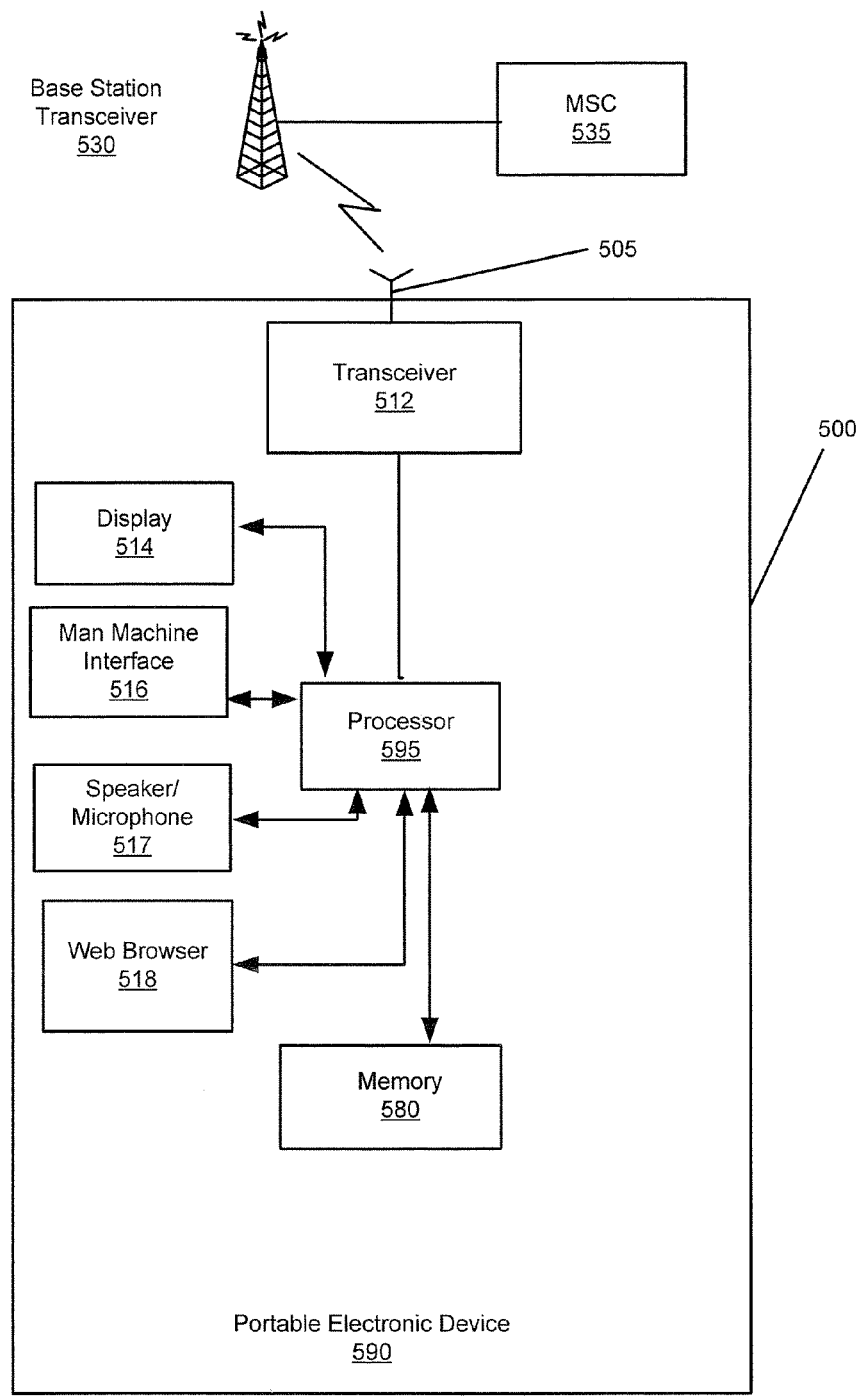
FIG. 5 is a schematic block diagram illustrating a portable electronic device and a cellular communication system in accordance with some embodiments of the present invention.

Referring now to FIG. 5, details with respect to portable electronic devices 590 in accordance with some embodiments of the present invention will be discussed. As illustrated in FIG. 5, the portable electronic device 590 includes a portable housing 500 and may include a display 514, a man machine interface (MMI) 516, a speaker/microphone 517, a web browser 518, a transceiver 512 and a memory 580, any of which may communicate with a processor 595. The processor 595 can be any commercially available or custom microprocessor.

As further illustrated in FIG. 5, the portable electronic device 590 communicates with a base station transceiver 530 connected to a mobile switching center ("MSC") 535 in accordance with some embodiments of the present invention. The transceiver 512 typically includes a transmitter circuit and a receiver circuit, which respectively transmit outgoing radio frequency signals to the base station transceiver 530 and receive incoming radio frequency signals, such as voice and data signals, from the base station transceiver 530 via an antenna 505. The antenna 505 may be an embedded antenna, a retractable antenna or any antenna known to those having skill in the art without departing from the scope of the present invention. The radio frequency signals transmitted between the portable electronic device 590 and the base station transceiver 530 may include both traffic and control signals (e.g., paging signals/messages for incoming calls), which are used to establish and maintain communication with another party or destination. The processor 595 may support various functions of the portable electronic device, including functions according to some embodiments of the present invention as will be discussed further herein.

It will be understood that in some embodiments of the present invention, the transceiver 512 may be a short range transceiver. The short range transceiver may be, for example, a Bluetooth transceiver, which may allow for high transfer rates of data over relatively short distances. It will be further understood that portable electronic devices 590 according to some embodiments of the present invention may include a wireless transceiver and a short range transceiver/transmitter.

In some embodiments of the present invention, the base station transceiver 530 includes the radio transceiver(s) that defines an individual cell in a cellular network and communicates with the portable electronic device 590 and other portable electronic devices in the cell using a radio-link protocol. Although only a single base station transceiver 530 is shown, it will be understood that many base station transceivers may be connected through, for example, a mobile switching center 535 and other devices to define a wireless communications network.

Although the present invention may be embodied in communication devices or systems, such as the portable electronic device 590, the present invention is not limited to such devices and/or systems. Instead, the present invention may be embodied in any apparatus that may be configured to operate in accordance with some embodiments of the present invention.

Figure 6:
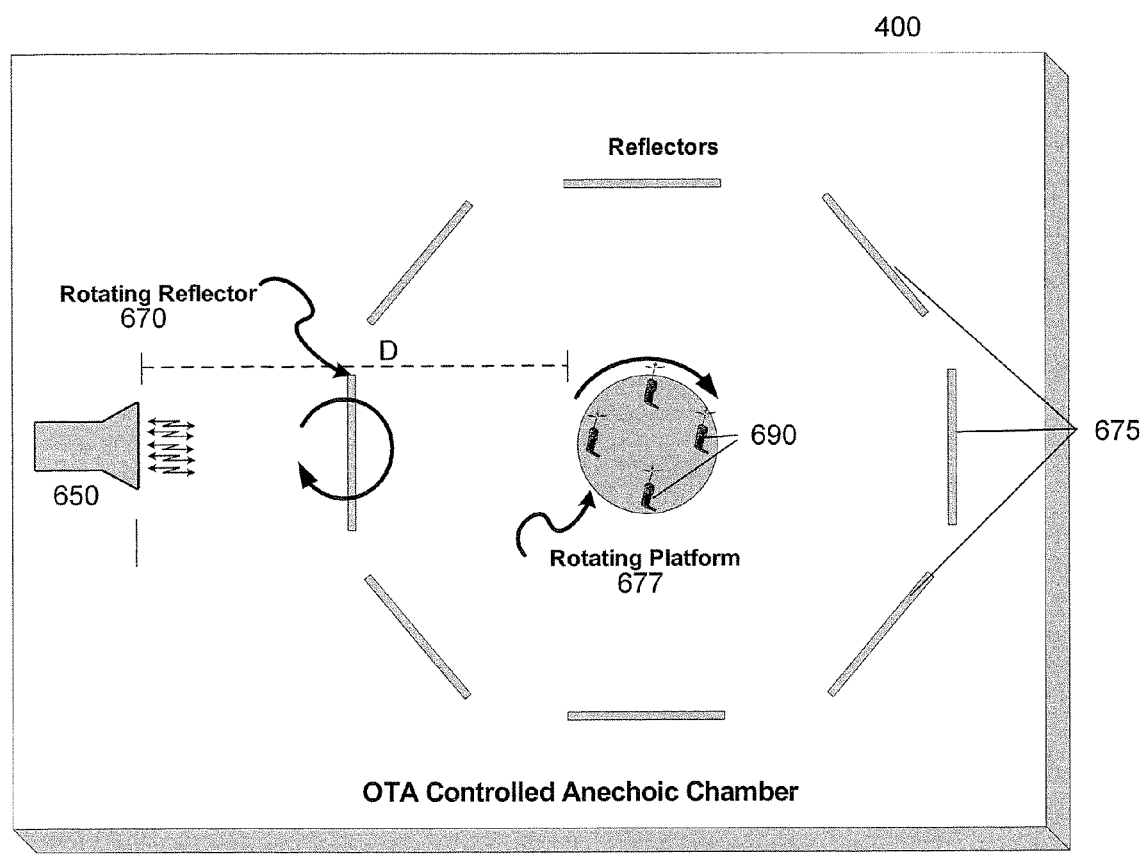
FIG. 6 is a more detailed block diagram of an LPA system in accordance with some embodiments of the present invention.

A more detailed block diagram of the LPA chamber will be discussed with respect to FIG. 6. As illustrated in FIG. 6, the LPA chamber 400 includes an antenna 650, a rotating turntable 677, a rotating screen 670 and a plurality of stationary screens 675. In some embodiments of the present invention, the chamber 400 is a quasi-anechoic screen room having dimensions of at least about 16 feet by about 24 feet. The inside of the chamber 400 is electrically isolated from the outside. Since the chamber 400 is only quasi-anechoic, some reflection does occur.

In some embodiments of the present invention, the testing may be performed using circular polarization. The antenna 650 may be a dual polarity wideband horn antenna that enables the circular polarization. The antenna 650 and the rotating turntable (platform) 677 may be positioned a distance D apart. In some embodiments, the distance D may be about 3 meters. The rotating screen 670 may be positioned half way between the antenna 650 and the rotating turntable. In some embodiments, the plurality of stationary reflector screens 675 may include eight stationary reflector screens that surround the turntable 677 as illustrated in FIG. 6. The stationary reflector screens 675 may be positioned in an elliptical pattern around the turntable 677.

In some embodiments, the rotating turntable 677 is configured to receive at least one portable electronic device 690 and to rotate in a circle during a test. In some embodiments, the at least one portable electronic device 90 may include a portable electronic device to be tested or reference portable electronic device 690. The reference portable electronic device 690 would typically be tested separately from the portable electronic device under test. A photograph of a rotating turntable in accordance with some embodiments of the present invention is provided in FIG. 10. As illustrated therein, the rotating turntable 1077 includes three device holders 1089. Each of the device holders 1089 is configured to receive a portable electronic device 1090 during a test in accordance with some embodiments of the present invention. Although the turntable 1077 illustrated in FIG. 10 includes three device holders 1089, embodiments of the present invention are not limited to this configuration. Less or more than three device holders 1089 may be included on the turntable 1077 without departing from the scope of the present invention. Furthermore, it will be understood that not all of the device holders 1089 provided on the turntable 1077 have to include a portable electronic device 1090 during a test, one or more of the holders 1089 may be empty.

Figure 11:
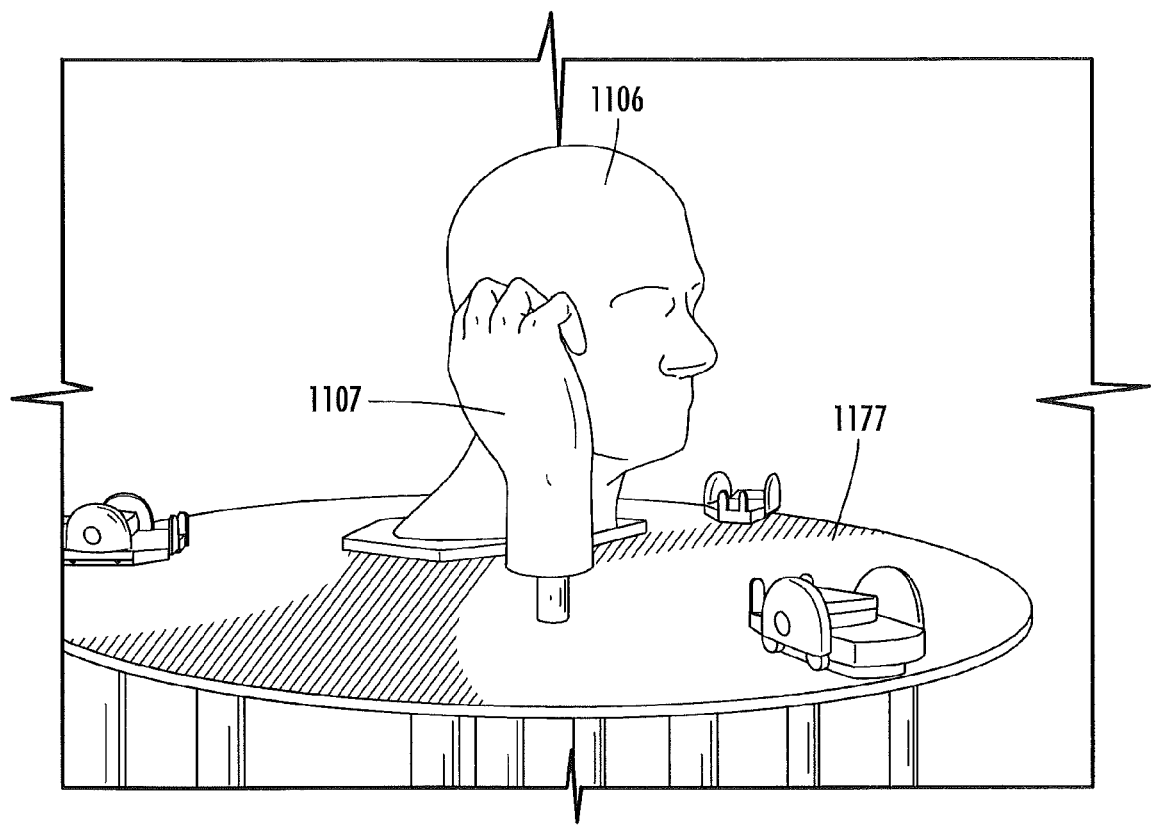
FIG. 11 is a photograph of a simulated head and hand on a rotating turntable in accordance with some embodiments of the present invention.

Referring again to FIG. 6, in some embodiments of the present invention, the rotating turntable 677 may be configured to receive more items than just a portable electronic device. For example, the turntable 677 may be configured to receive a simulated head, a simulated hand and/or at least one portable electronic device. These items would be rotated with the turntable 677 during the test. In particular, FIG. 11 is a photograph of a turntable 1177 having both a simulated head 1106 and a simulated hand 1107 positioned thereon. The simulated hand 1107 can be configured to hold a portable electronic device during a test.

Figure 12A:
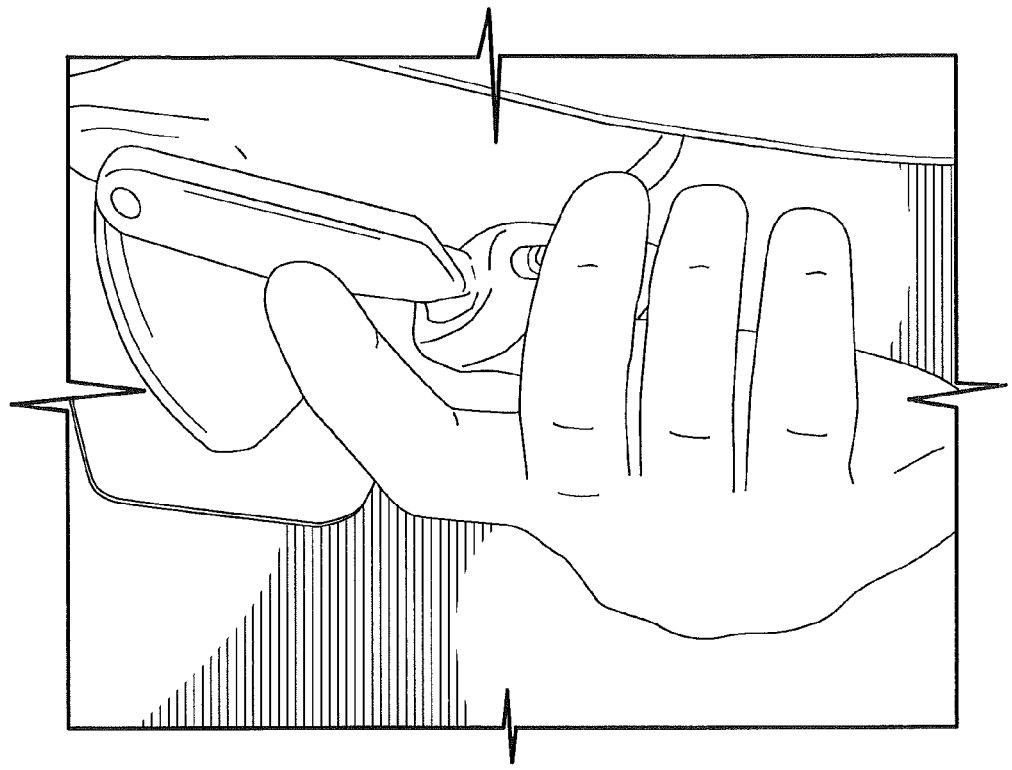
FIGS. 12A through 12D are various photographs of hand positions of simulated hands in accordance with some embodiments of the present invention.
Figure 12B:
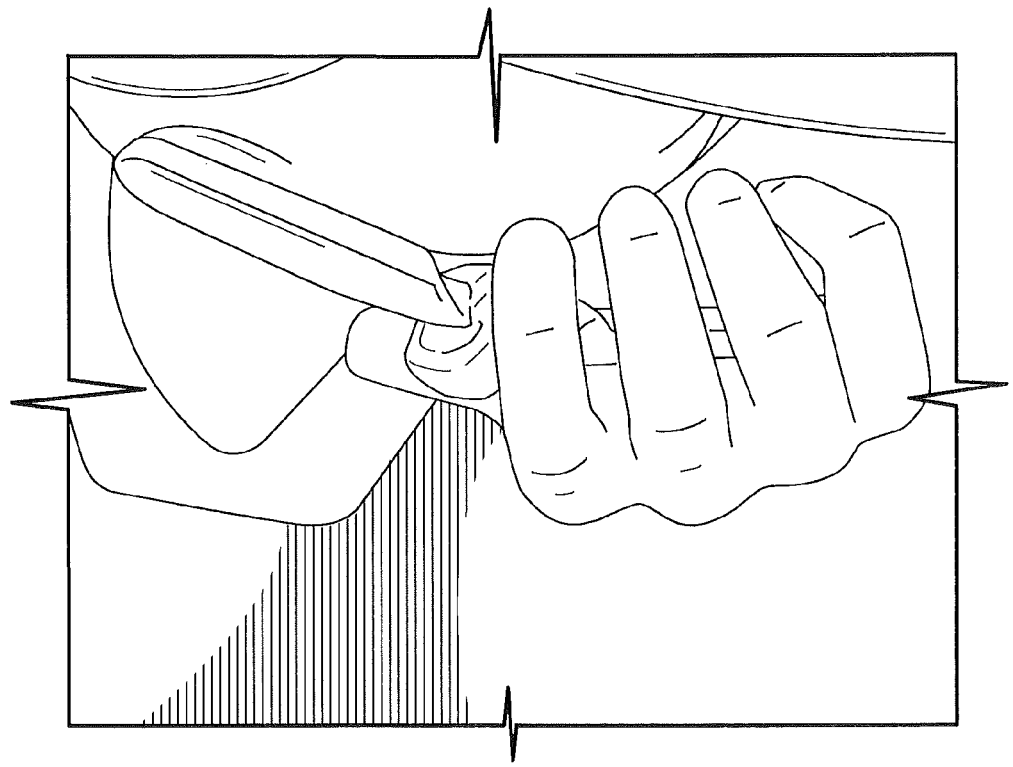
Figure 12C:
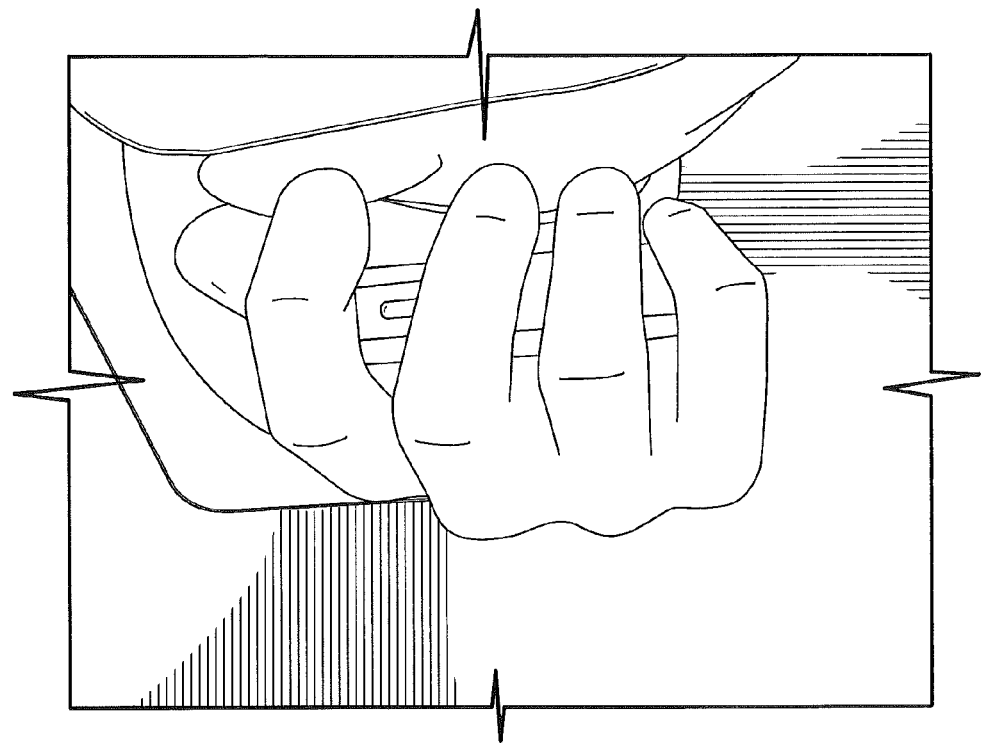
Figure 12D:
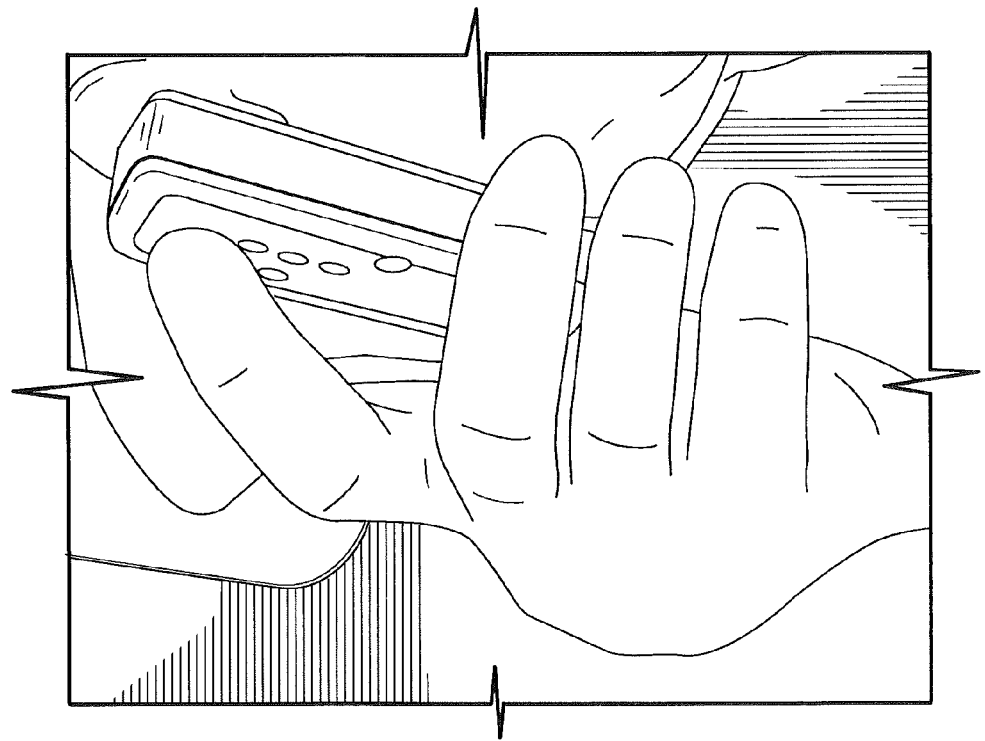

According to some embodiments of the present invention, the simulated hand 1107 may have one of eight different hand positions. Four of these hand positions are illustrated in the photographs of FIGS. 12A through 12D. FIG. 12A illustrates the index finger of the hand positioned touching the flip of the portable electronic device. FIG. 12B illustrates the index finger of the hand positioned at the hinge of the portable electronic device. FIG. 12C illustrates the middle finger of the hand positioned at the hinge of the portable electronic device. FIG. 12D illustrates the index finger positioned at the top of the base of the portable electronic device.

As is clear, the photographs in FIGS. 12A through 12D illustrate a right hand. The other four hand positions are the same hand positions illustrated in FIG. 12A through 12D using the left hand instead of the right. These hand positions are provided herein as examples only. Any hand position that can be envisioned by those having skill in the art may be used without departing from the scope of the present invention. The use of the simulated head and/or hands in close proximity to the portable electronic device 690 during a test allows the test to factor in real world interference introduced by the user's head and/or hand. Accordingly, test results provided by systems in accordance with some embodiments of the present invention may reflect real world results.

Figure 8:
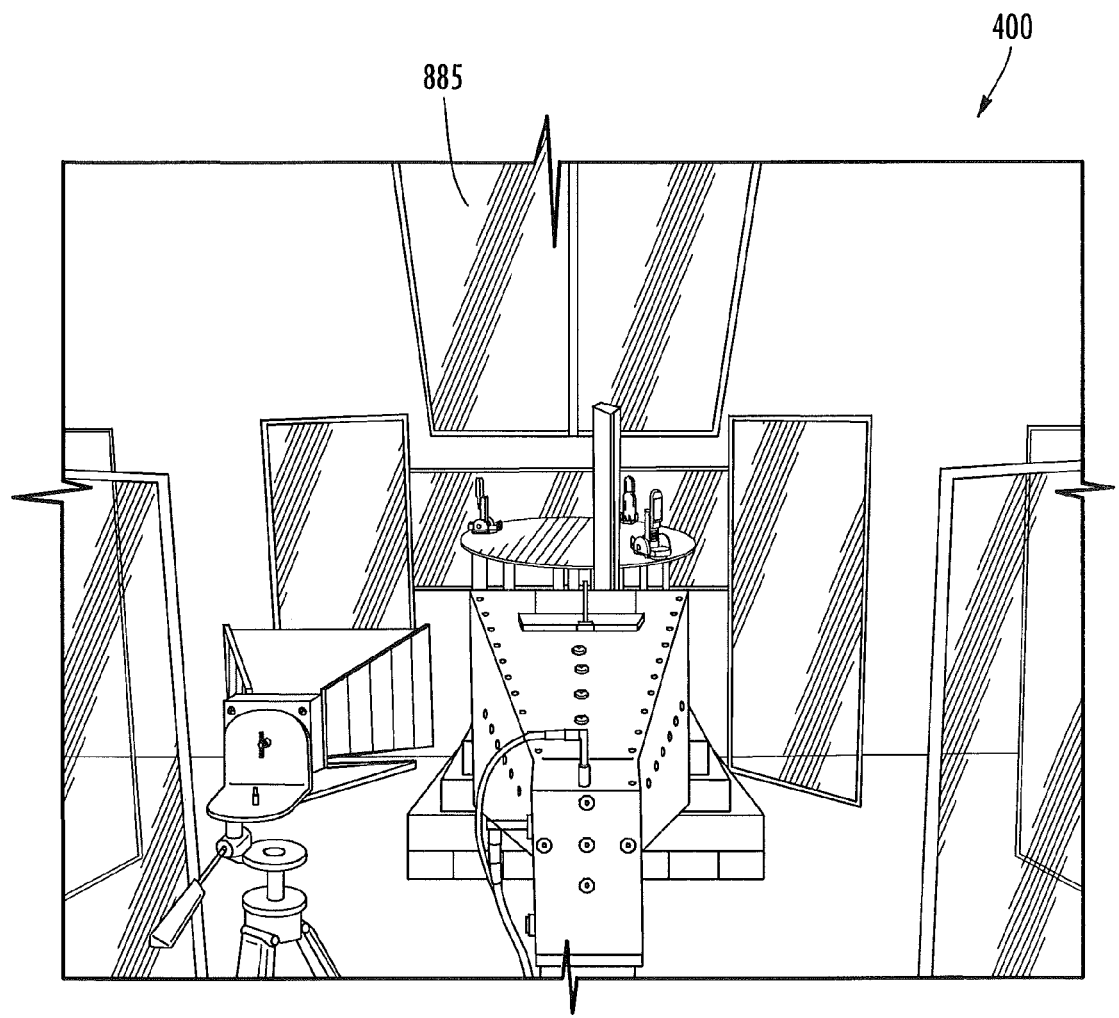
FIG. 8 is a photograph of an LPA system in accordance with some embodiments of the present invention.

Referring again to FIG. 6, in some embodiments of the present invention, the chamber 400 may further include a set of stationary corner reflector screens 885 visible in FIG. 8. As illustrated in FIG. 8, the set of stationary corner reflector screens 885 may be positioned behind the rotating turntable 677 opposite the antenna 650. As further illustrated in FIG. 9, the set of stationary corner reflector screens 885A and 885B may be positioned at a 45 degree angle from the wall 905 and at a 90 degree angle with respect to each other.

Figure 7:
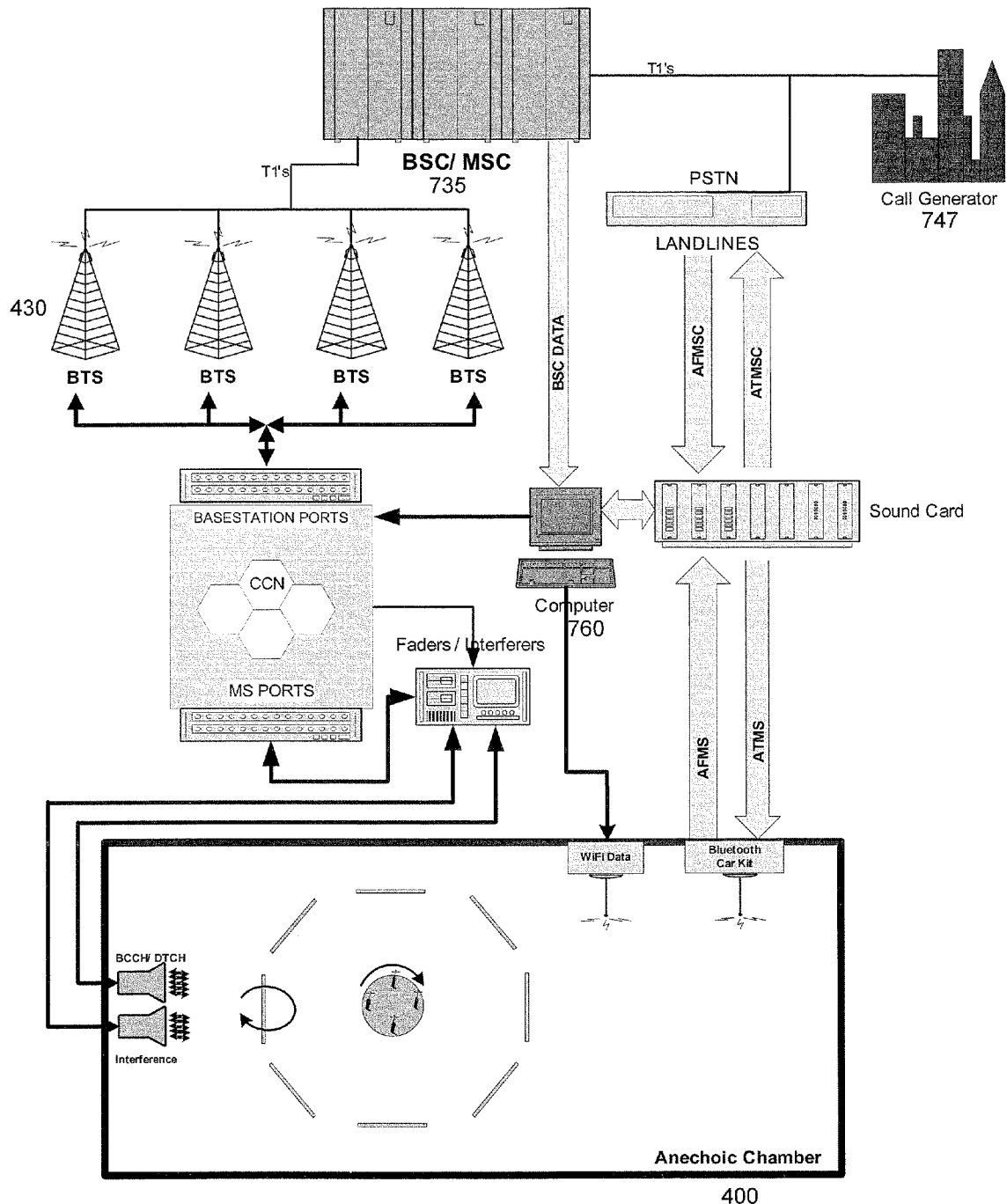
FIG. 7 is a block diagram of an LPA system connected to a live wireless network in accordance with some embodiments of the present invention.

As illustrated in FIG. 7, in some embodiments, the LPA system may be coupled to base stations 430 in a live wireless network during a test. It will be understood that the LPA system according to some embodiments of the present invention may be connected to a testbox, however, the results produced may not be as accurate as those performed with the live network. As further illustrated in FIG. 7, the LPA chamber 400 may be connected to multiple BTSs 430, BSC/MSC 735, a call generator 747 and a computer 760 as discussed above with respect to FIG. 4.

Details with respect to the operation of the LPA system in accordance with some embodiments of the present invention will now be discussed with respect to FIGS. 6 and 7. As discussed briefly above, the LPA system in accordance with some embodiments of the present invention is built around a live network, for example, a Global System for Mobile communication (GSM) network or a Universal Mobile Telecommunications Service (UTMS) network, using real base stations, base station controllers, media gateway, system switch and other elements that make up a real commercial network as illustrated in FIGS. 4 and 7. The difference between the LPA system and a real system is that the LPA system is not commercial, i.e., it does not have cell sites and towers and only places and receives calls within the lab.

As discussed above, in some embodiments, the LPA chamber is at least about 16 by 24 foot quasi-anechoic screen room with a set of rotating and stationary screens 675, 670 and a test turntable 677 as discussed above. In some embodiments, the base stations are provided by four Radio Base Stations (RBS). One base stations is provided for each of the 850, 900, 1800 and 1900 MHz bands in a GSM network to operate the portable electronic devices under test. Each base station is completely under the control of the test operator via a link window on the Unix control computer 760. It will be understood that although the control computer is discussed herein as being a Unix computer, embodiments of the present invention are not limited to this configuration. Each of the four base stations are only used by the LPA system and have various parameters that can be customized based on the test configuration.

In some embodiments, each RBS may be cabled to a remote controlled switch unit mounted in the main rack panel in the lab. A test operator can use a window on the Unix computer 760 to switch from one base to another without physically having to change the cable. From that switch, a main cable runs to the chamber bulkhead and passes through the master attenuator. The remaining equipment is housed inside the chamber 400, as is the operator. The master attenuator can be either manually or automatically controlled without departing from the scope of the present invention.

From the master attenuator, the signal passes to a Duplexer Switch. This allows one to split the Downlink (DL) and Uplink (UL) sub-bands via duplexer filters. Splitting the signals allows for individual attenuation of the sub-bands to balance the links. The signals are then recombined by another set of duplex filters and the recombined signal passes through the Duplexer Switch to the antenna input.

The signal is split just before the antenna 650 so that a Vector Signal Analyzer (VSA) can be attached. This allows one to measure both the DL and UL signals at will. In some embodiments, the VSA may be used to monitor the DL signal going to the antenna 650. Two other Spectrum Analyzers may be provided to monitor the UL signals while testing, thus, both the DL and the UL may be monitored at the same time.

As discussed above, in some embodiments, the antenna may be a dual-polarity wideband horn antenna. It has both Vertical and Horizontal polarization, so the antenna 650 does not have to be physically rotated to change polarity. A Coaxial Phase Shifter may be inserted into the line leading to the antenna Horizontal input. This may be set, by band, to produce a left-handed circularly polarized signal (LHCP). For example, the signal may actually be rotating like a corkscrew between the antenna 650 and the portable electronic device 690 under test. This aspect is important as it averages out any polarization of the antenna of the portable electronic device 690 such that no one orientation will be better than another.

At this point, the signal is no longer in a cable, it is passing through space across a three meter test range from the antenna 650 to the rotating turntable 677. Right in the middle of the range is a rotating screen 670. In some embodiments, the rotating screen 670 may be provided by an aluminum window screen. The rotating screen 670 operates as a fader, and it fades the signal up and down between the base and the portable electronic device, think of the antenna 650 as the base tower at this point. When the rotating screen 670 is parallel with the path, the signal is at maximum and when it is perpendicular to the path, it is at minimum. In some embodiments of the present invention, the maximum fade may be about 15 dB.

As discussed above, the rotating turntable 677 is configured to receive the portable electronic devices 690 and slowly rotate the portable electronic devices 690 around in a circle, for example, a circle having a diameter of about three feet. As they are rotated, the signals are averaged to account for radiation patterns due to the antenna and portable electronic device mechanics.

Figure 9:
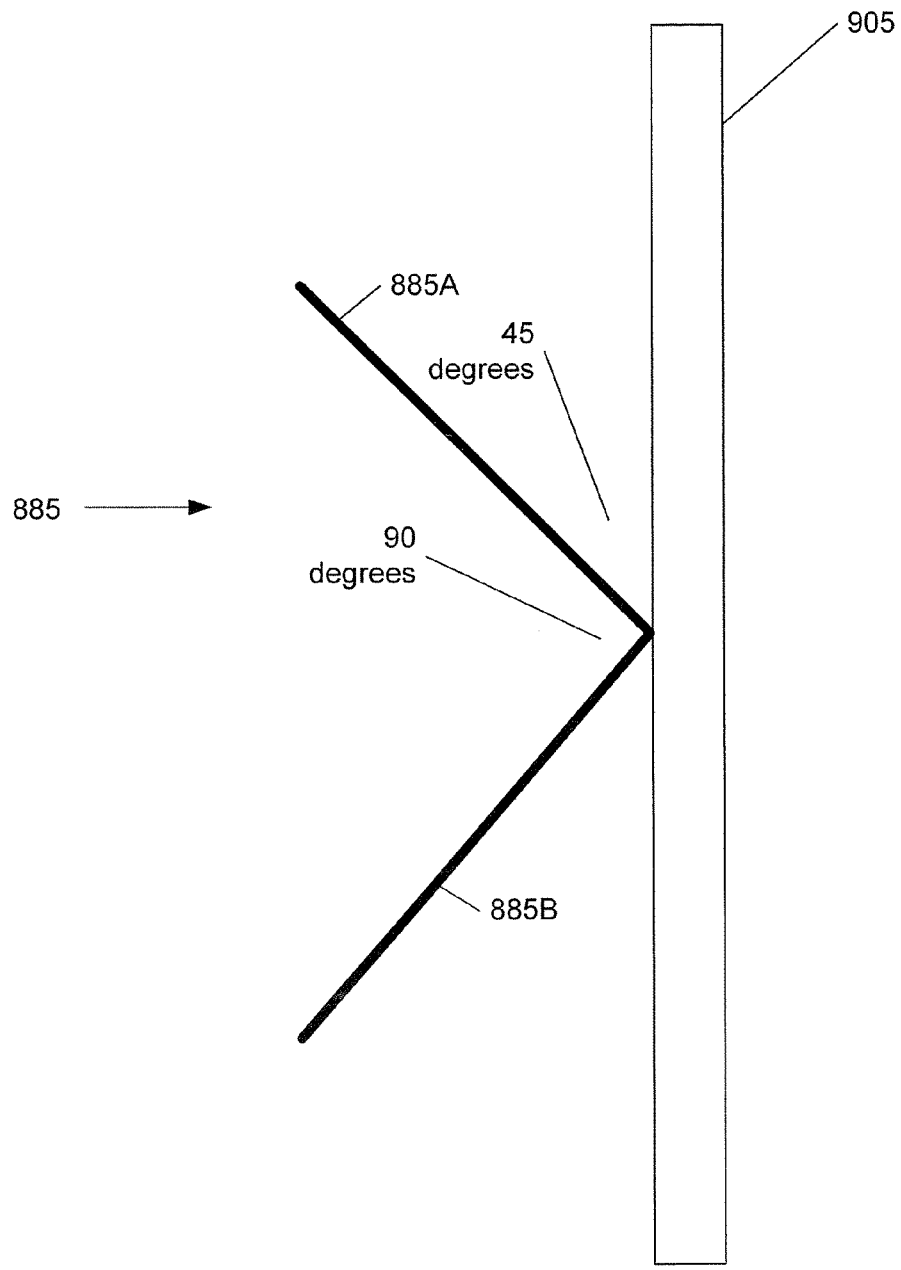
FIG. 9 is a detailed block diagram of a stationary corner reflector screen of FIG. 8 in accordance with some embodiments of the present invention.
Figure 10:
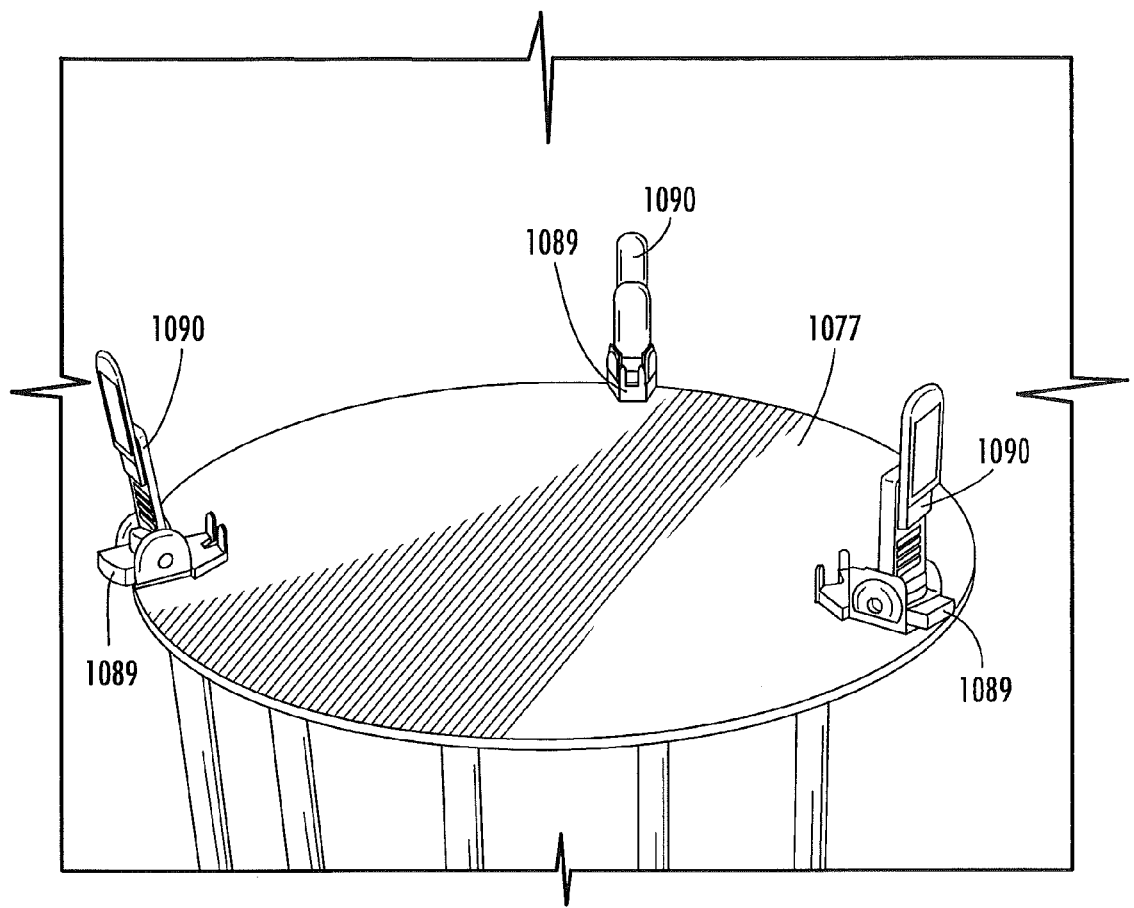
FIG. 10 is a photograph of a rotating turntable in accordance with some embodiments of the present invention.

Behind the rotating turntable 677 are the corner reflector screens 885. In some embodiments, the set of corner reflector screens 885 may be a set of aluminum window screens set at forty-five degrees from the wall 905 as illustrated in FIG. 9. The corner reflector screens 885 reflect any signal heading up or down out of the portable electronic devices 690 as they pass around the rear of the turntable 677. The corner reflector screens 885 are present in case there are any high-angle lobes coming out of the portable electronic device 690.

Finally, there are stationary reflector screens 675. In some embodiments of the present invention, there are eight stationary reflector screens 675. The reflector screens 675 are spaced around the test range in a circle/ellipse with gaps in between to produce a multipath condition to occur. As the fader screen 670 rotates, it reflects signals to and from the stationary screens 675, providing many paths, which will both add and subtract from each other. The purpose of the fader 670 and stationary screens 675, along with the turntable 677, is to simulate the RF conditions experienced by portable electronic devices operating in the real world.

Accordingly, some embodiments of the present invention provide a controlled over the air test methodology that may be used to characterize a portable electronic devices' RF performance in a multi-path environment. Tests in accordance with some embodiments of the present invention closely simulate a real world urban environment. Conventional development testing focuses on conducted measurements or chambers designed to eliminate any multi-paths. Thus, test results according to some embodiments of the present invention more accurately reflect real world performance of the portable electronic device.

Figure 13:
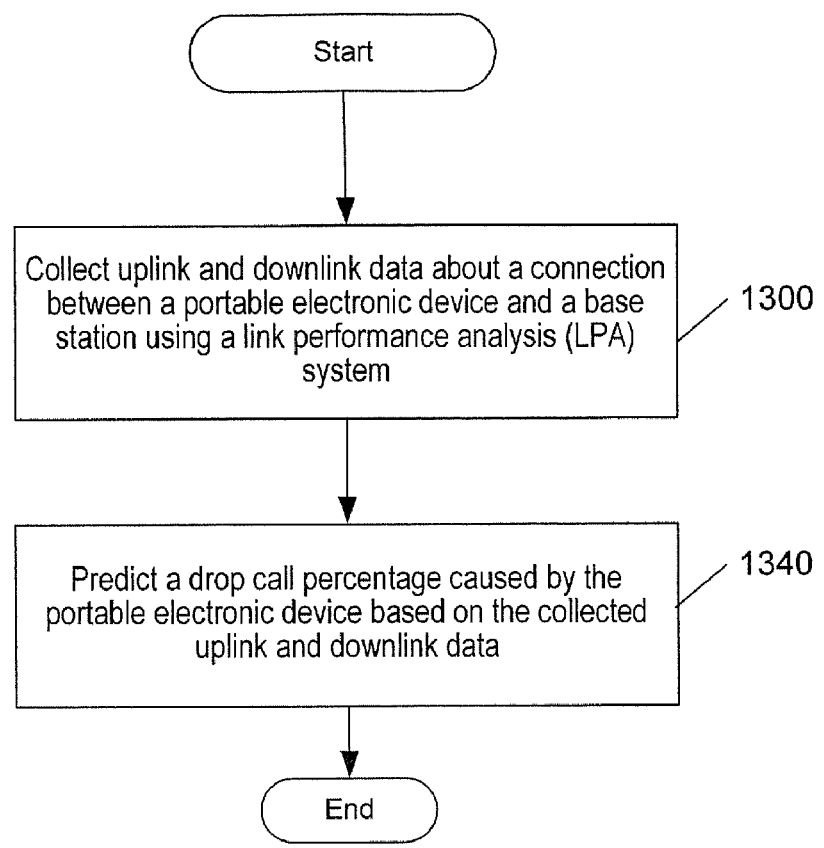
FIGS. 13 and 14 are flowcharts illustrating methods according to various embodiments of the present invention.

Operations in accordance with various embodiments of the present invention will now be discussed with respect to the flowcharts of FIGS. 13 and 14. Referring first to FIG. 13, operations for predicting RF performance in a wireless network begin at block 1300 by collecting uplink and downlink data about a connection between a portable electronic device and a base station using the LPA system in accordance with some embodiments of the present invention. A drop call percentage caused by the portable electronic device may be predicted based on the collected uplink and downlink data (block 1340). As discussed above, the LPA system may include a shielded chamber; an antenna positioned in the chamber; a rotating turntable positioned in the chamber and spaced apart from the antenna; a rotating screen positioned in the chamber between the antenna and the rotating turntable; and a plurality of stationary screens spaced apart from and surrounding the rotating turntable.

As additional uplink and downlink data about the connection is collected using the LPA system, the predicted drop call percentage may be refined based on the collected additional uplink and downlink data as will be discussed further below.

Figure 14:
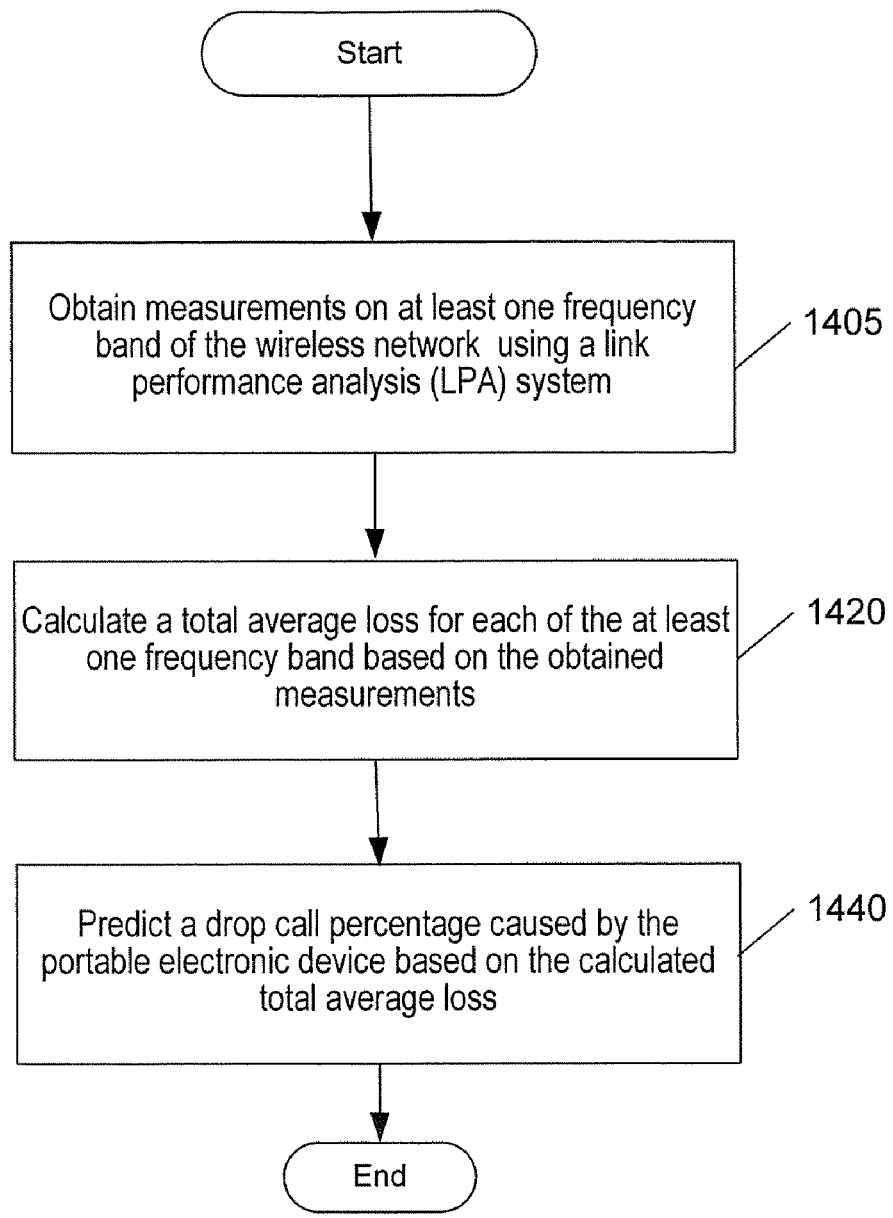

Referring now to FIG. 14, operations begin at block 1405 by obtaining measurements on at least one frequency band in the wireless network using the LPA system. A total average loss for each of the at least one frequency bands may be calculated based on the obtained measurements (block 1420).

In these embodiments, the drop call percentage caused by the portable electronic device may be predicted based on the calculated total average loss for each of the at least one frequency bands (block 1440).

In some embodiments, obtaining measurements on at least one frequency band in the wireless network (1405) includes obtaining measurements on four GSM frequency bands in the wireless network using the LPA system. The four GSM frequency bands include 850, 900, 1800 and 1900 MHz. However, embodiments of the present invention are not limited to GSM. For example, four UMTS bands may be used without departing from the scope of the present invention.

Thus, according to some embodiments of the present invention, methods and computer program products are provided that predict RF performance of a portable electronic device in a wireless network as it relates to drop calls. In particular, using data collected using the LPA multi-path test and measurement system discussed above as input to a software, % RIF (drop call % caused by the portable electronic device) can be accurately predicted. % RIF is the main unit of measure in determining the RF performance of the portable electronic devices in customer networks.

As discussed above, uplink and downlink measurement results are obtained on frequency bands, for example, on all 4 GSM bands using the LPA system. As discussed above, the LPA system can include simulated head and/or hand having multiple possible hand positions, for example, eight as discussed above. These hand positions are measured across 3 channels (low, mid, high) for the band being tested. Each measurement is taken for about 5 minutes giving approximately 625 readings. So for one channel for 6 hand positions, 3750 (625×6) readings may be taken. Across the band being tested about 11,250 (3750×3) readings may be obtained. The measured values for each hand position is averaged together to get the average loss for that one position on a given channel. Separate readings are obtained for uplink (transmitter) and downlink (receiver). This is done for all hand positions and all 3 channels tested. Then, the 3 channel measurements for each hand position are averaged together to get the loss value for that one hand position across the band being tested. This gives us separate loss values for each hand position for the uplink and loss values for each hand position for the downlink for the band being tested. These values are averaged together to give the total average loss for the band being tested and also the standard deviation or variance is calculated from these loss values.

Data from these measurements may be added to a data table. In some embodiments, the data table is provided by JMP 7 software provided by SAS of Cary, N.C. However, it will be understood that any modeling statistical software may be used without departing from the scope of the present invention. For example, the input values available to the statistical modeling software may include:

head & hand loss for uplink (band average) (850 & 1900 bands)
head & hand loss for downlink (band average) (850 & 1900 bands)
standard deviation between hand positions for uplink loss (850 & 1900 bands)
standard deviation between hand positions for downlink loss (850 & 1900 bands)
free space loss for uplink (band average) (850 & 1900 bands)
free space loss for downlink (band average) (850 & 1900 bands)
mobile phone form factor (clam, stick, slider)
mobile phone antenna type (internal, external)
mobile phone antenna location (bottom, top)
mobile phone manufacture (SEMC, Motorola, Nokia, etc.)

Also for the creation of the model, the known drop call rate (% RIF) for as many mobiles as possible are obtained.

Using the Fit Model routine within JMP, the % RIF data column may be added to the "Y variable" and all of the columns above to the "Construct Model Effects" box may be added. The "stepwise" personality may be selected to allow JMP to decide which of these data points are meaningful in trying to predict the drop call rate. JMP determines which of these data points are the most important and it is determined that the 850 Uplink standard deviation between hand positions, the 850 Uplink Loss Average and the 850 Downlink Loss Average which are the most meaningful data points. This would then suggest that how the end user maneuvers their hand around the phone is a key determining factor to the drop call rate. So it is more than just the loss that the hand causes, it is the amount that the loss changes as the hand is moved to various spots on the phone that is a key contributor to higher drop call rates.

An example of the head & hand loss summary data from LPA on the 850 band is provided in Table 1 below. Each value provided in Table 1 is the average of about 625 measurements.

TABLE 1

| | Uplink (Tx) Loss in dB | | | Downlink (Rx) Loss in dB | | | Uplink | Dnlink |
|---|---|---|---|---|---|---|---|---|
| | Ch 128 | Ch 190 | Ch 248 | Ch 128 | Ch 190 | Ch 248 | 3 Ch Avg | 3 Ch Avg |
| RH Pos 1 | −16.1 | −15.8 | −17.1 | −14.7 | −15.4 | −16.4 | −16.3 | −15.5 |
| RH Pos 2 | −13.2 | −12.6 | −11.6 | −9.8 | −9.5 | −10.6 | −12.5 | −10.0 |
| RH Pos 3 | −11.4 | −9.7 | −11.0 | −11.5 | −10.5 | −11.4 | −10.7 | −11.1 |
| RH Pos 4 | −16.3 | −15.6 | −15.4 | −13.6 | −14.2 | −16.4 | −15.8 | −14.7 |
| LH Pos 2 | −13.5 | −12.9 | −13.1 | −13.6 | −14.6 | −15.9 | −13.2 | −14.7 |
| LH Pos 3 | −15.0 | −15.7 | −16.1 | −15.6 | −16.7 | −17.4 | −15.6 | −16.6 |
| Total Band Loss Average (6 hand positions) | | | | | | | −14.0 | −13.8 |
| Standard Deviation of 6 hand positions | | | | | | | 2.2 | 2.6 |

An example of a formula created by JMP is set out below. This formula may be recreated on occasion as the RIF values are refined and added to the data table.

$$
\begin{aligned}
&0.00357815635991528 + \text{Match}(\,:\text{Antenna Type}, \\
&\quad \text{"Stub"}, 0.00169833459541246, \\
&\quad \text{"Internal/Loop"}, -0.00169833459541246, \\
&\quad \cdot \\
&\quad) + \text{Match}(\,:\text{Antenna Location}, \\
&\quad \text{"Bottom"}, 0.0000024598670644093, \\
&\quad \text{"Top"}, -0.0000024598670644093, \\
&\quad \cdot \\
&\quad) + \text{Match}(\,:\text{Name}(\text{"**Coded Manufacturer"}\,), \\
&\quad \text{"ModelsA-F"}, -0.00048671356890767, \\
&\quad \text{"Non-SEMC"}, 0.0011286611137985, \\
&\quad \text{"SEMC"}, -0.000641947544890829, \\
&\quad \cdot \\
&\quad) + \text{Match}(\,:\text{Form Factor}, \\
&\quad \text{"Clam"}, 0.000211478997325279, \\
&\quad \text{"Stick"}, 0.0004661375622944164, \\
&\quad \text{"Swivel/Slider"}, -0.000677616559619443, \\
&\quad \cdot \\
&\quad) + 0.00120013599154183 * :\text{Name}(\text{"**850 UL StdDev"}\,) \\
&\quad + 0.000632461580765697 * :\text{Name}(\text{"850 UL Loss Avg"}\,) \\
&\quad + -0.000432086347192434 * :\text{Name}(\text{"850 DL Loss Avg"}\,)
\end{aligned}
$$

Using the formula example above, the measured values for 850 UL StdDev, 850 UL Loss Avg & 850 DL Loss Avg can be added to get a predicted % RIF for the mobile. Using this example for the first two phones launched in the customer network, the method according to some embodiments of the present invention predicted the % RIF to within less than 10% of the 3-5 month average.

Accordingly, some embodiments of the present invention provide methods, systems and computer program products for accurately predicting % RIF as discussed above. Results in accordance with embodiments of the present invention correlate very well to real world performance. Various test results are summarized in the graphs and charts of FIGS. 15 through 31.

Figure 15:
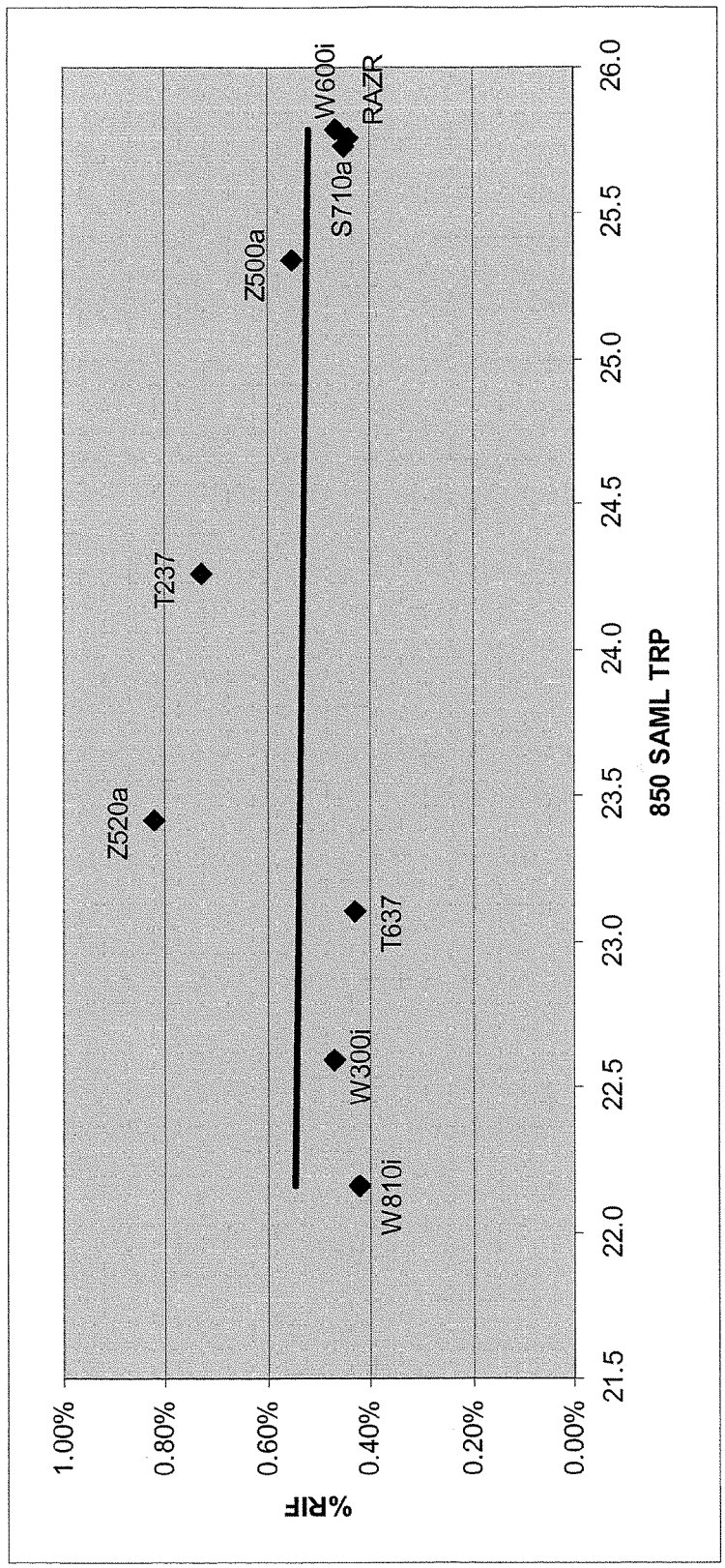
FIGS. 15 through 30 are graphs illustrating test results obtained using an LPA system in accordance with some embodiments of the present invention.

Referring first to FIG. 15, a graph illustrating 850M SAM L test results versus actual % RIF (drop call % caused by the portable electronic device) from January 2007 will be discussed. As illustrated therein, portable electronic devices (phones) having the SAM L TRP still have very good RIF performance. The SAM L data included in the graph in FIG. 15 is from SEMC RTP ETS AMS 8600 System.

Figure 16:
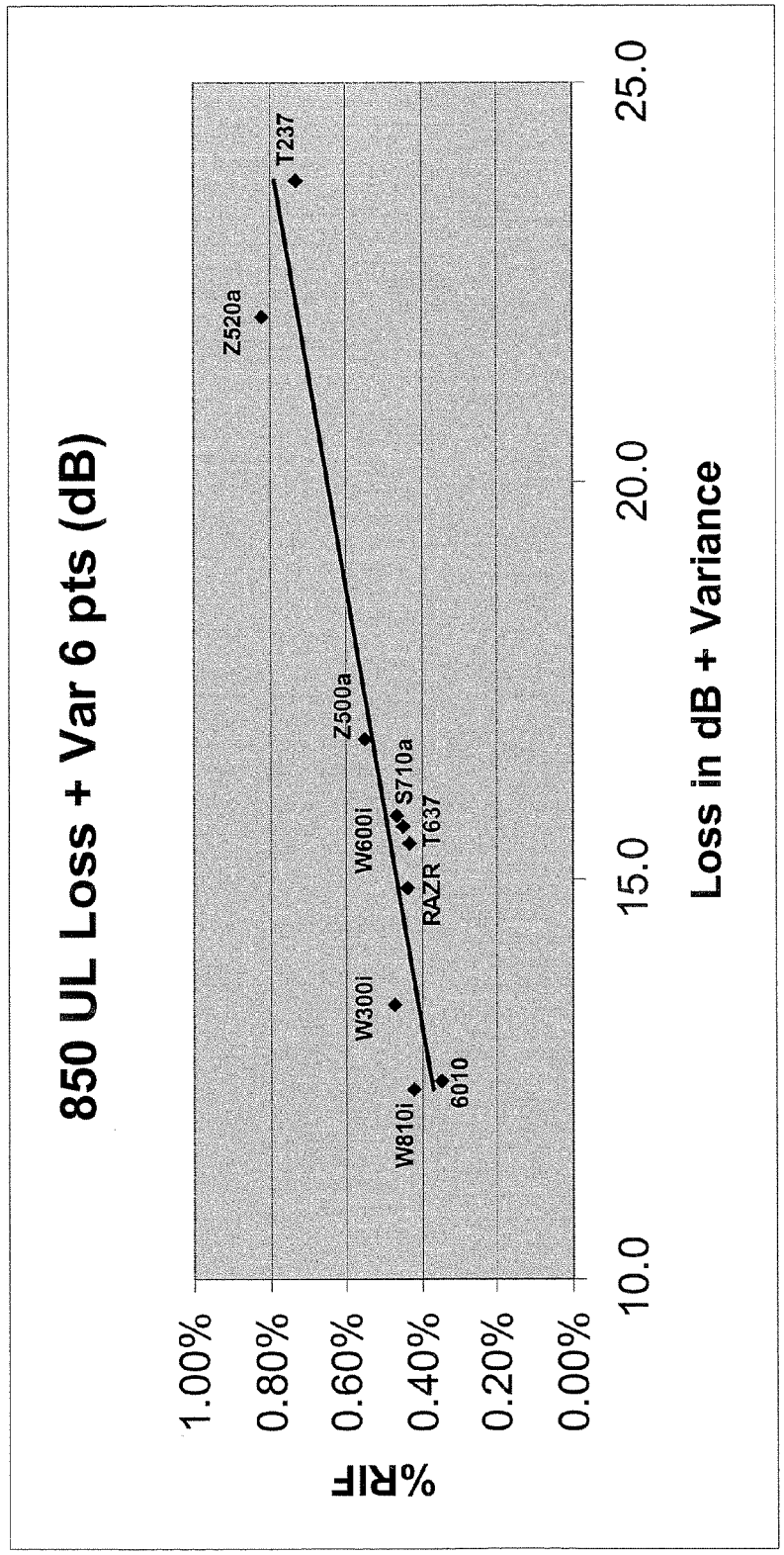

Referring now to FIG. 16, a graph illustrating 850M Uplink Average Loss+Variance 6 pts versus actual % RIF from January 2007 will be discussed. As illustrated in FIG. 16, 850M UL LPA loss+6 position hand variance shows best RIF correlation.

Figure 17:
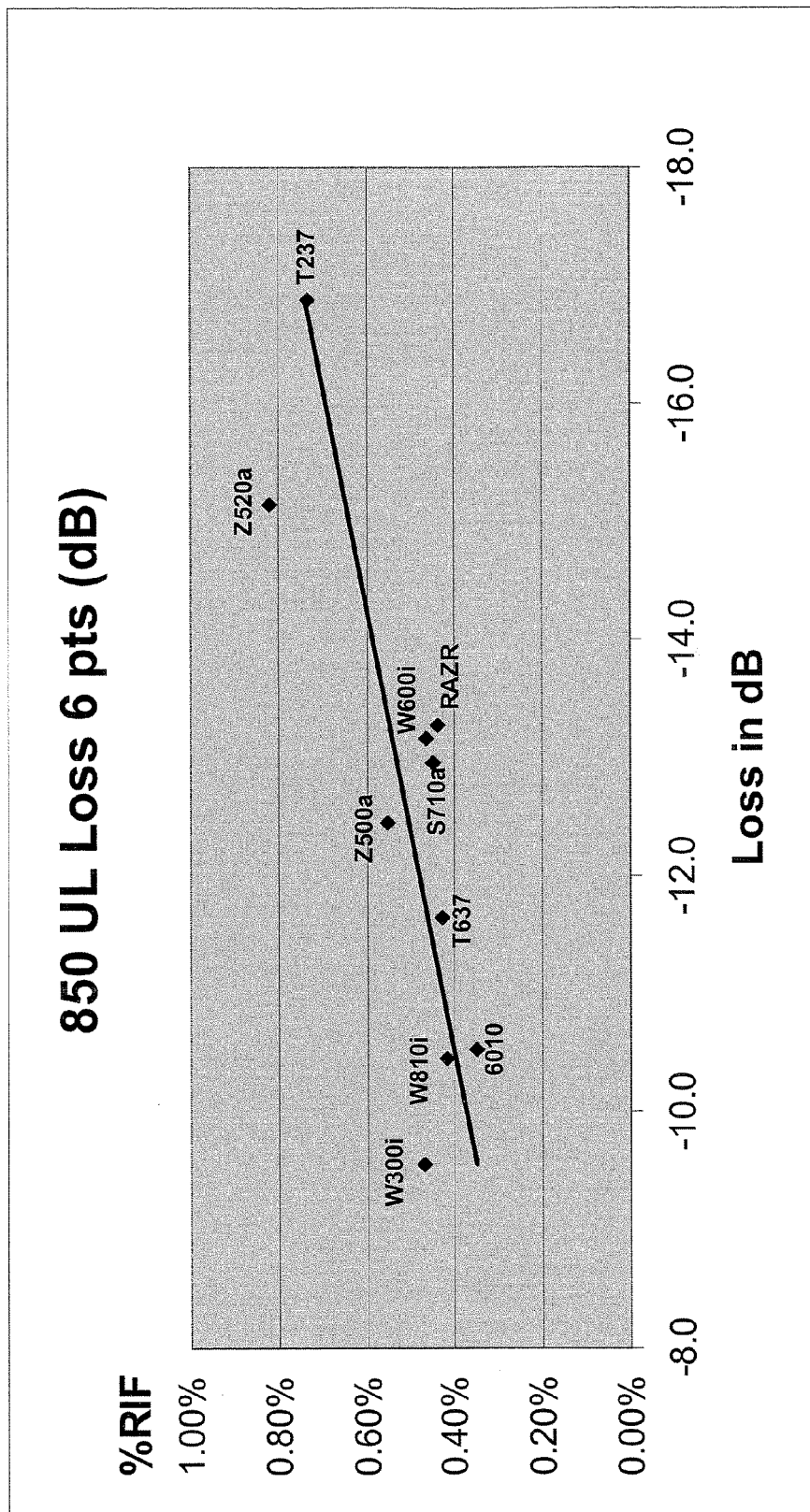

Referring now to FIG. 17, a graph illustrating 850M Uplink Average Loss versus actual % RIF for January 2007 will be discussed. As illustrated in FIG. 17, 850M UL LPA 6 position loss shows some correlation with RIF.

Figure 18:
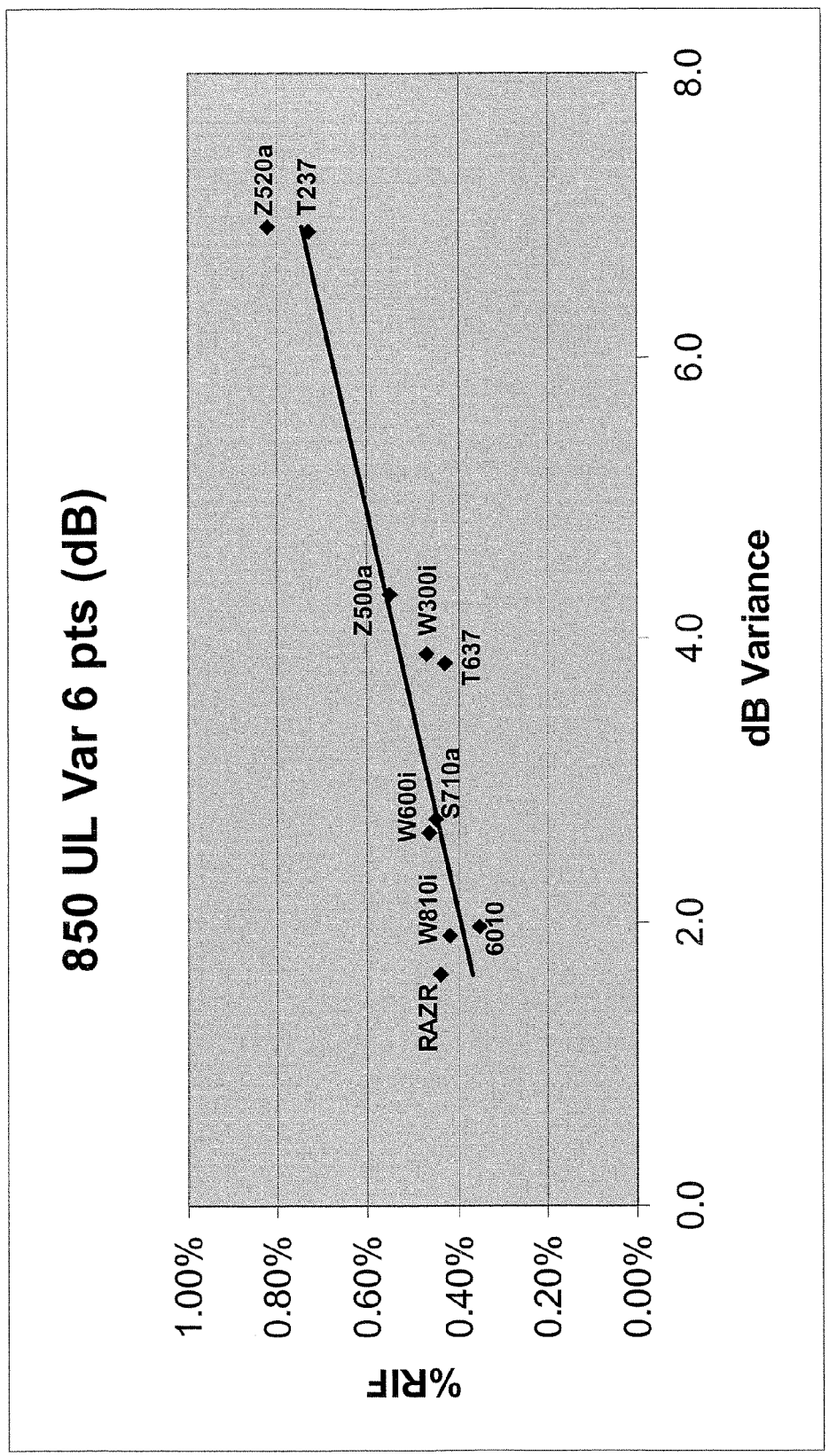

Referring now to FIG. 18, a graph illustrating 850M Uplink Variance 6 pts versus % RIF for January 2007 will be discussed. As illustrated in FIG. 18, 850M UL LPA 6 position variance shows some correlation to RIF.

Figure 19:
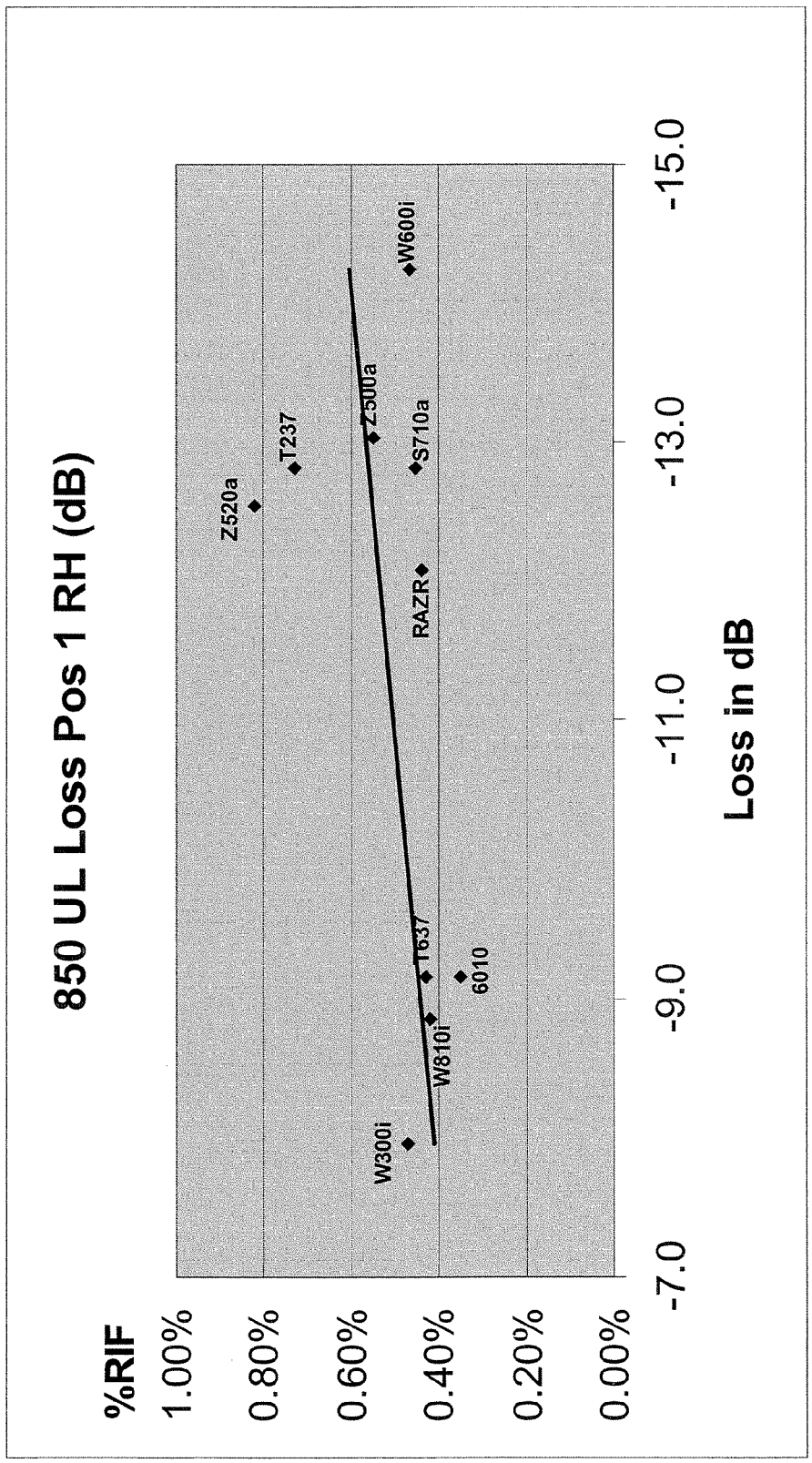

Referring now to FIG. 19, a graph illustrating 850M Uplink Loss Hand Position 1 RH versus % RIF for January 2007 will be discussed. As illustrated in FIG. 19, Position #1 right hand exhibited limited RIF correlation.

Figure 20:
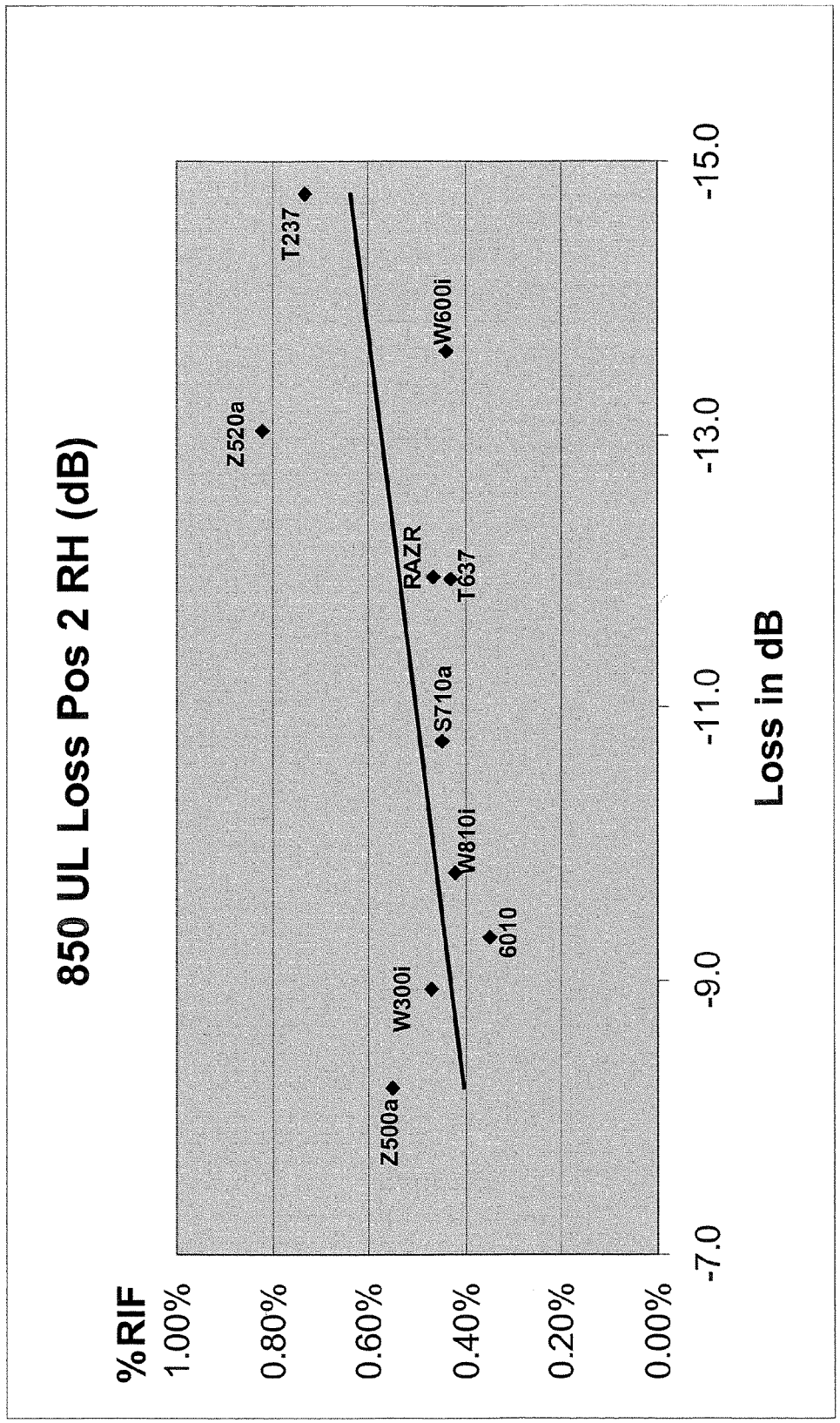

Referring now to FIG. 20, a graph illustrating 850M Uplink Loss Hand Position 2 RH versus % RIF for January 2007 will be discussed. As illustrated in FIG. 20, Position #2 right hand has limited RIF correlation.

Figure 21:
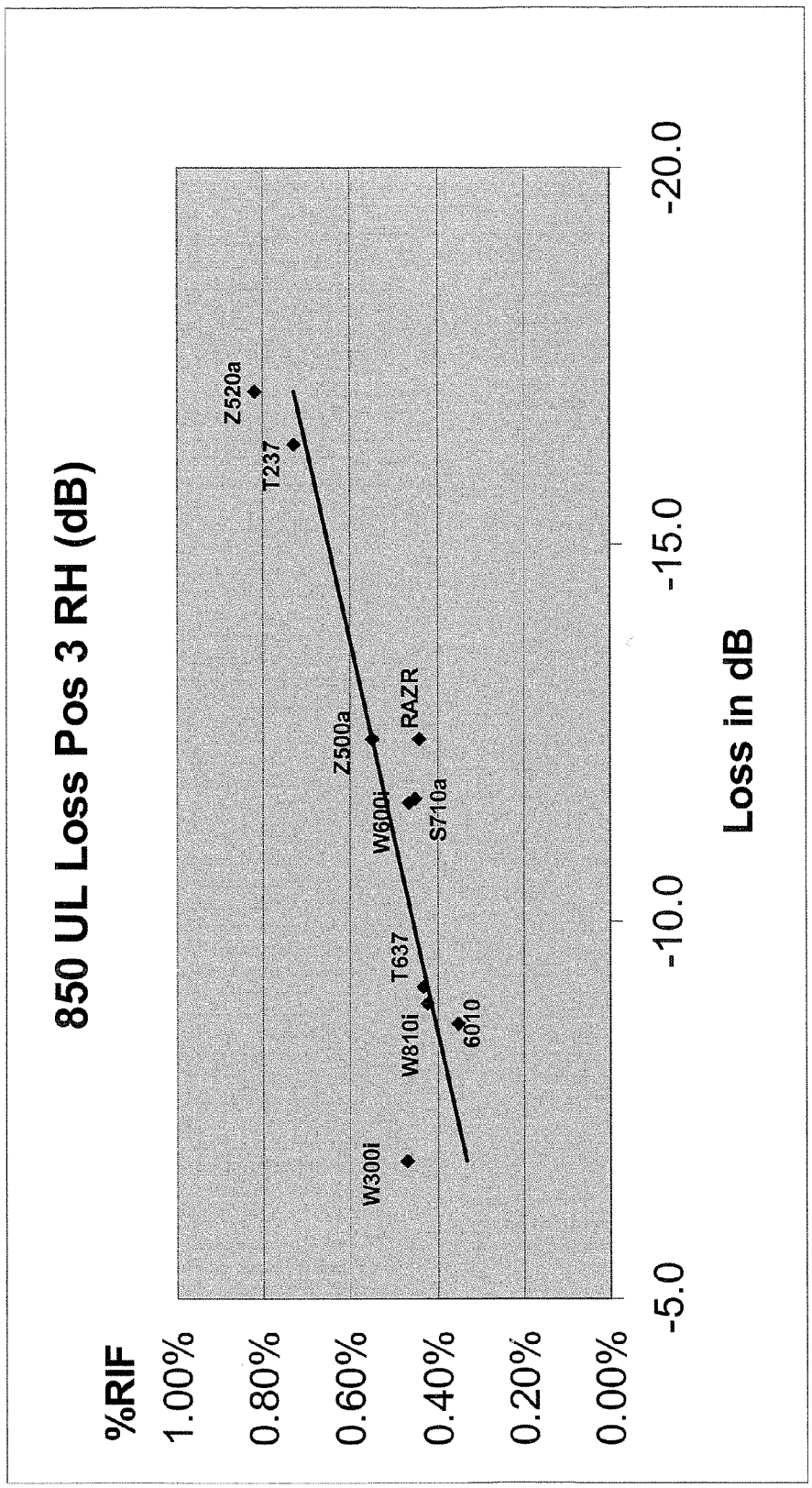

Referring now to FIG. 21, a graph 850M Uplink Loss Hand Position 3 RH versus % RIF for January 2007 will be discussed. As illustrated in FIG. 21, Position #3 right hand has the best RIF correlation of all six hand positions.

Figure 22:
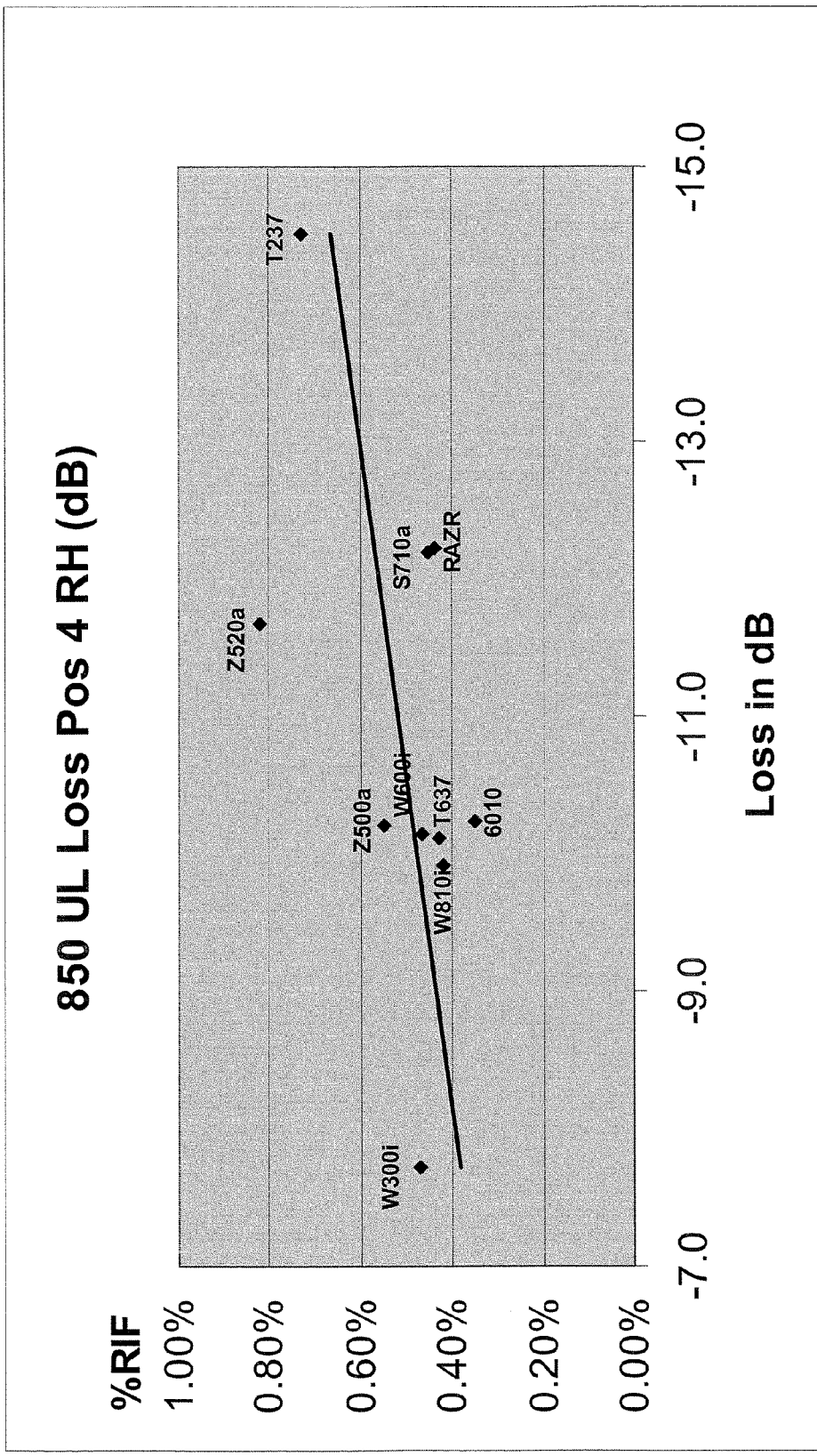

Referring now to FIG. 22, a graph 850M Uplink Loss Hand Position 4 RH versus % RIF for January 2007 will be discussed. As illustrated in FIG. 22, position #4 has limited RIF correlation.

Figure 23:
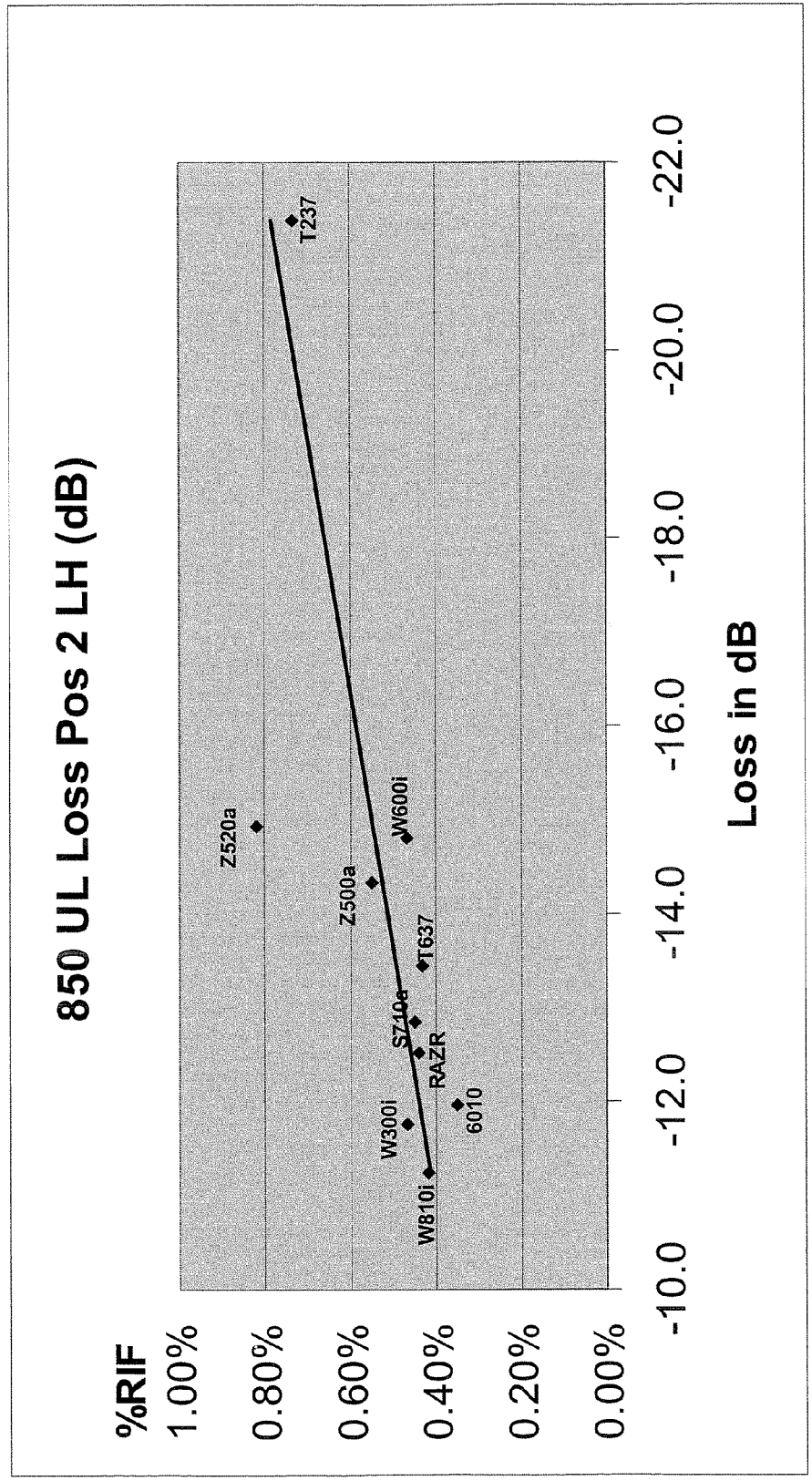

Referring now to FIG. 23, a graph 850M Uplink Loss Hand Position 2 LH versus % RIF for January 2007 will be discussed. As illustrated in FIG. 23, position #2 left hand has limited RIF correlation.

Figure 24:
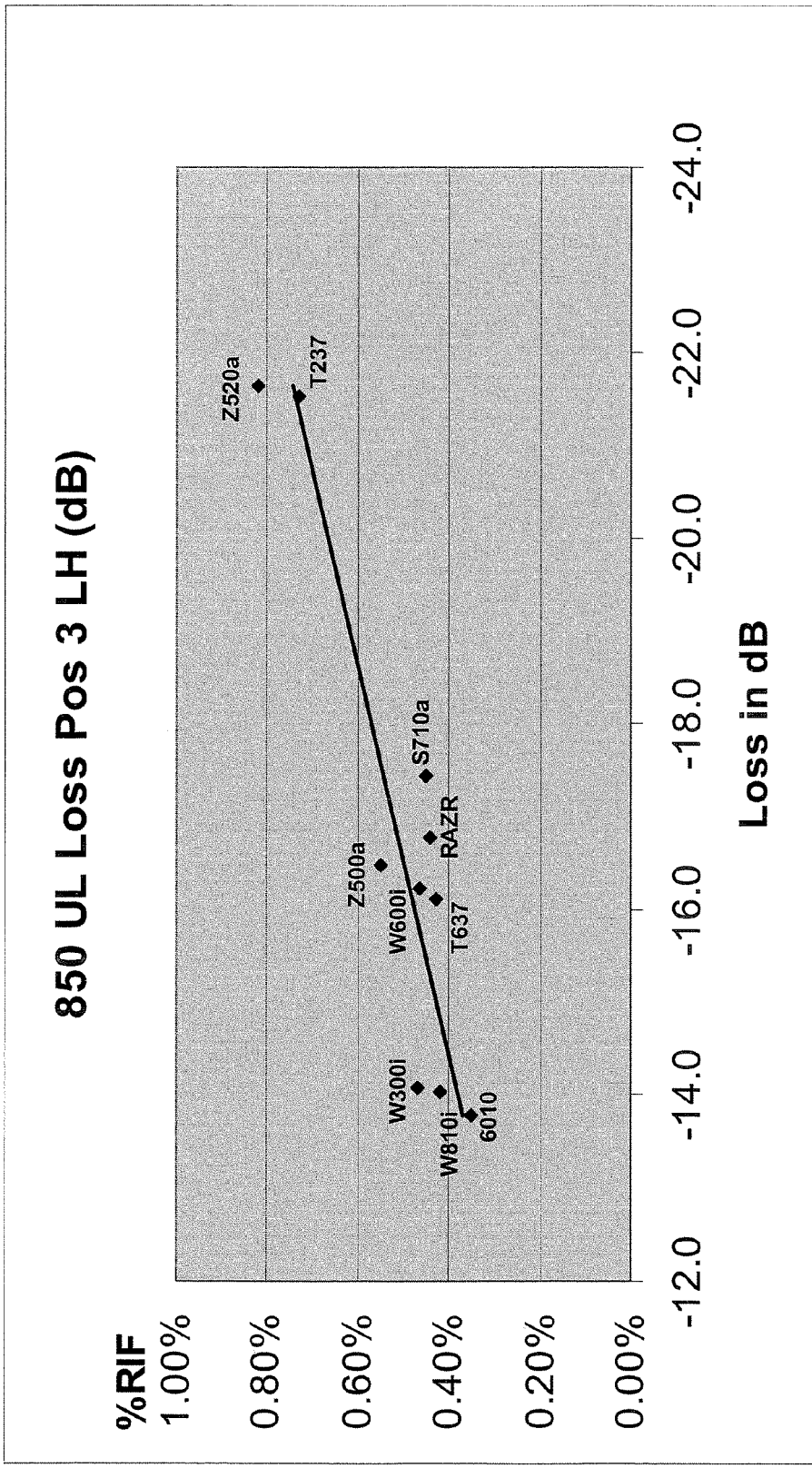

Referring now to FIG. 24, a graph 850M Uplink Hand Position 3 LH versus % RIF for January 2007 will be discussed. As illustrated in FIG. 24, position #3 left hand has limited RIF correlation.

Figure 25:
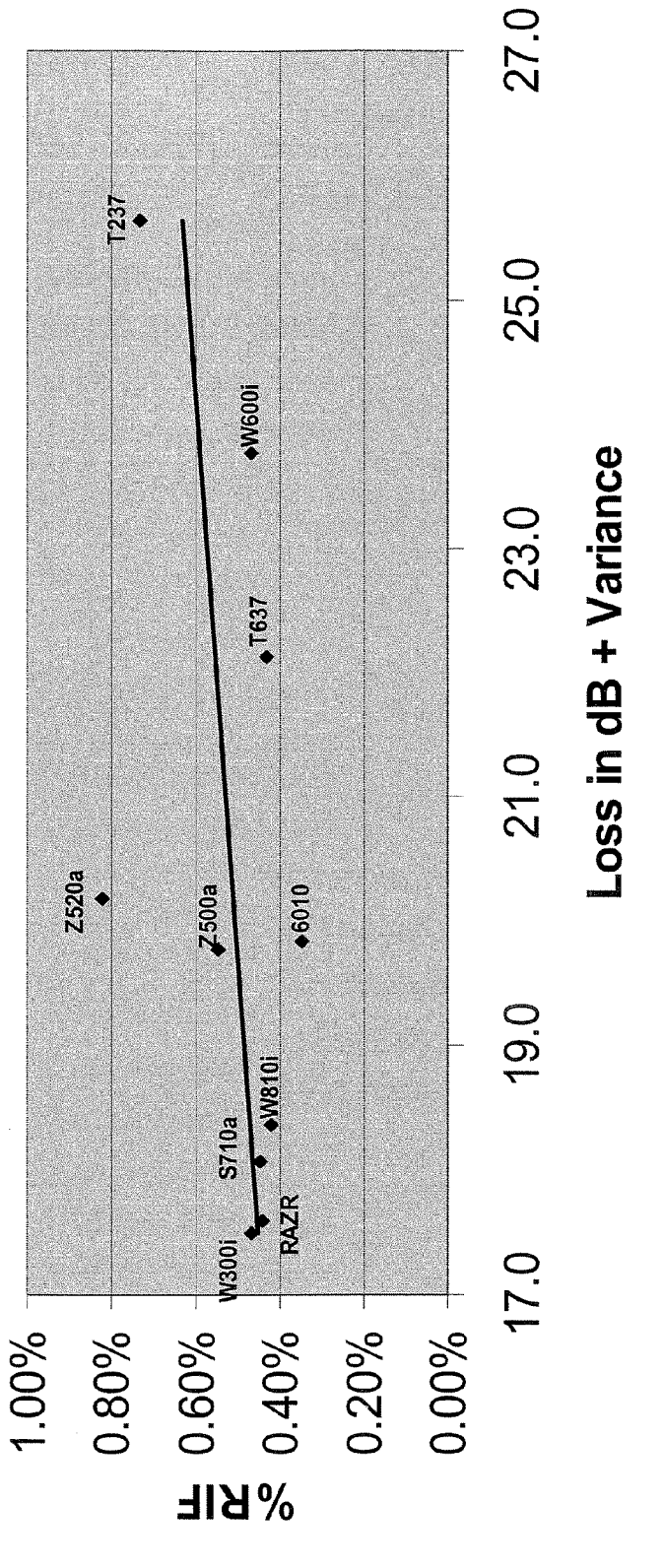

Referring now to FIG. 25, a graph illustrating Loss in dB plus variance versus % RIF for January 2007 (850M downlink compare) will be discussed. As illustrated in FIG. 25, 850M DL LPA loss+6 position variance has limited correlation to RIF.

Figure 26:
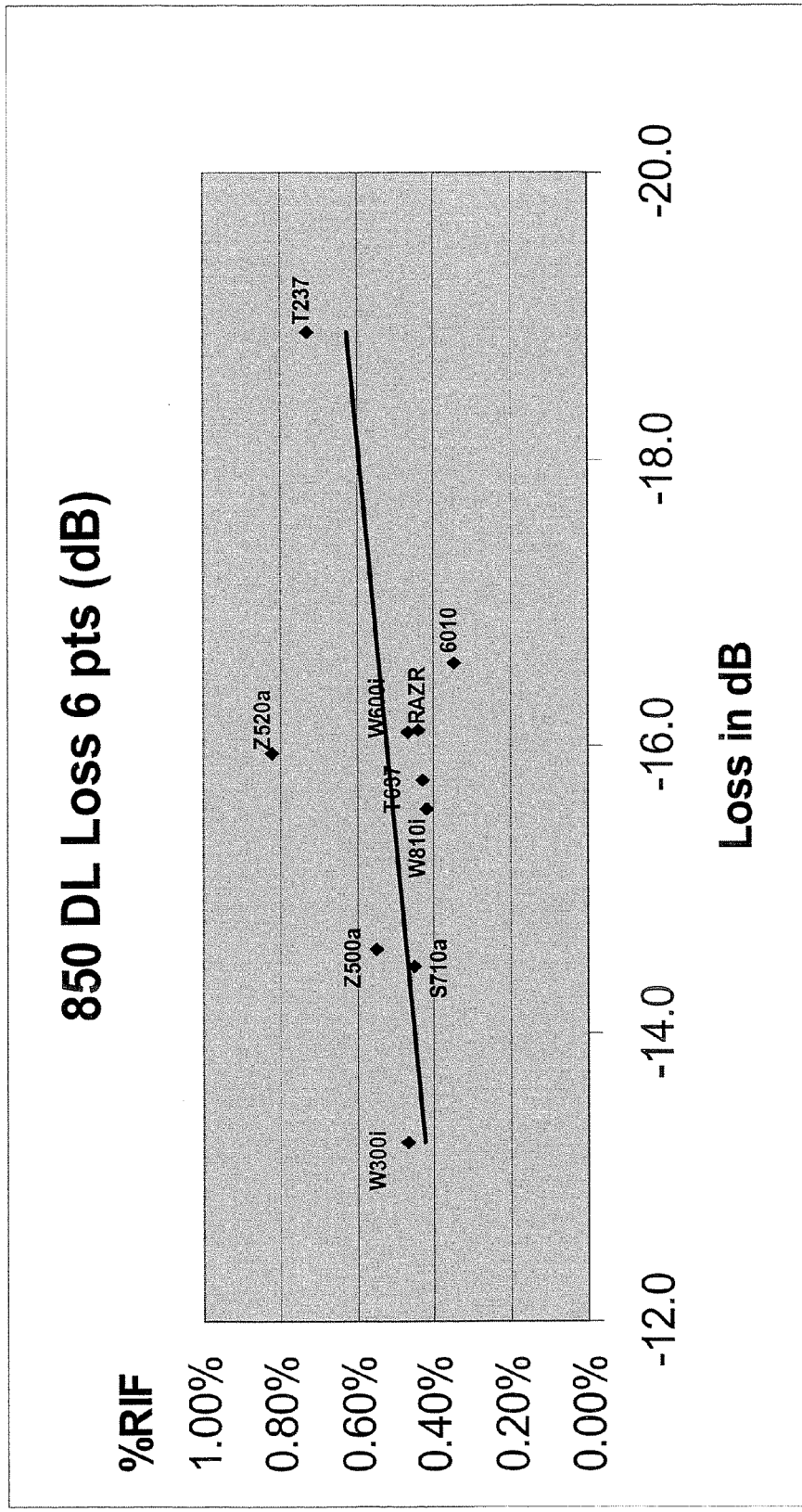

Referring now to FIG. 26, a graph illustrating Loss in dB versus % RIF for January 2007 (850M downlink compare) will be discussed. As illustrated in FIG. 26, 850M DL LPA loss has limited correlation to RIF.

Figure 27:
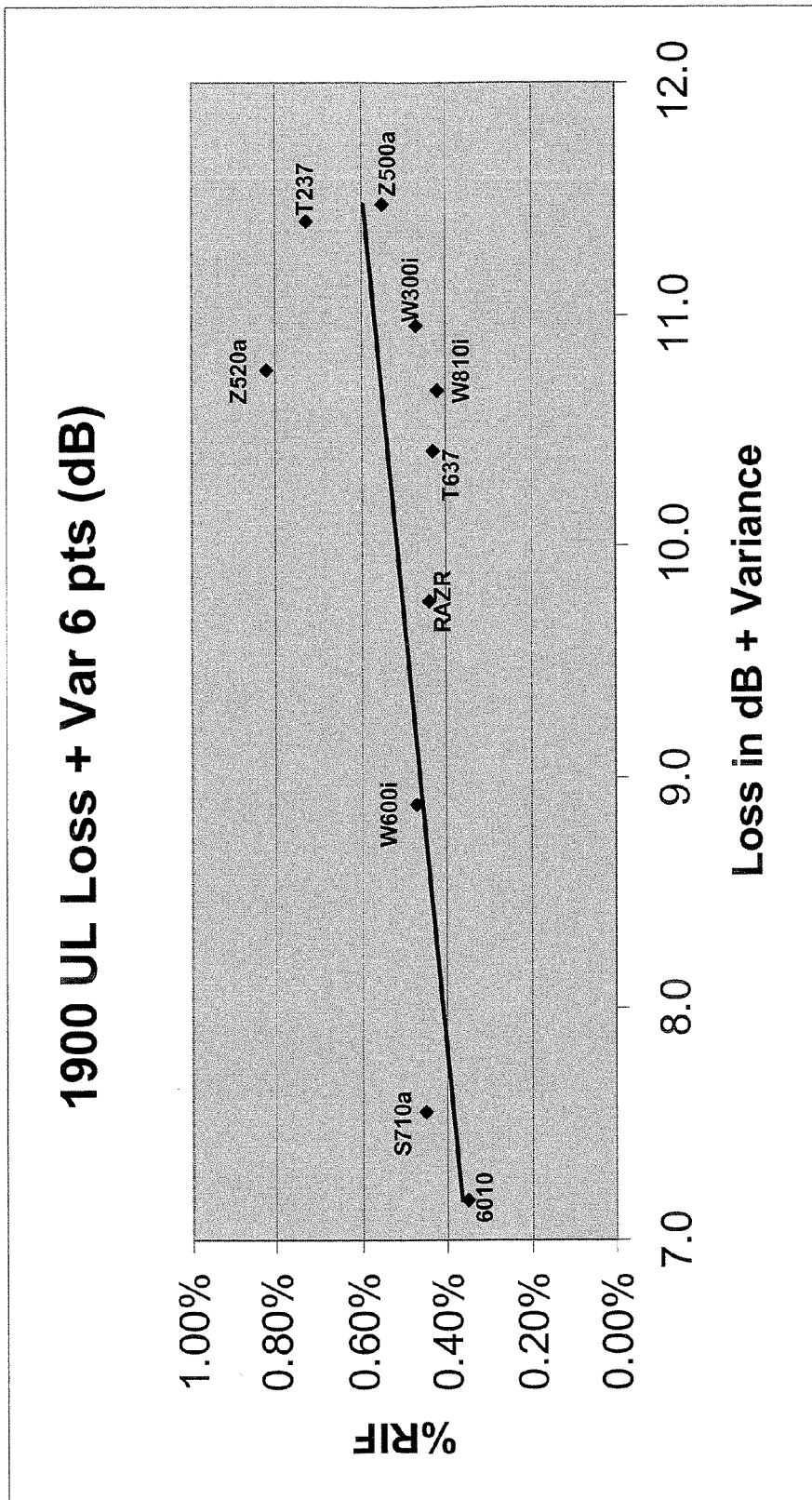

Referring now to FIG. 27, a graph illustrating Loss in dB plus variance versus % RIF for January 2007 (1900 Uplink compare) will be discussed. As illustrated in FIG. 27, 1900M LL LPA loss+6 position variance has limited correlation to RIF.

Figure 28:
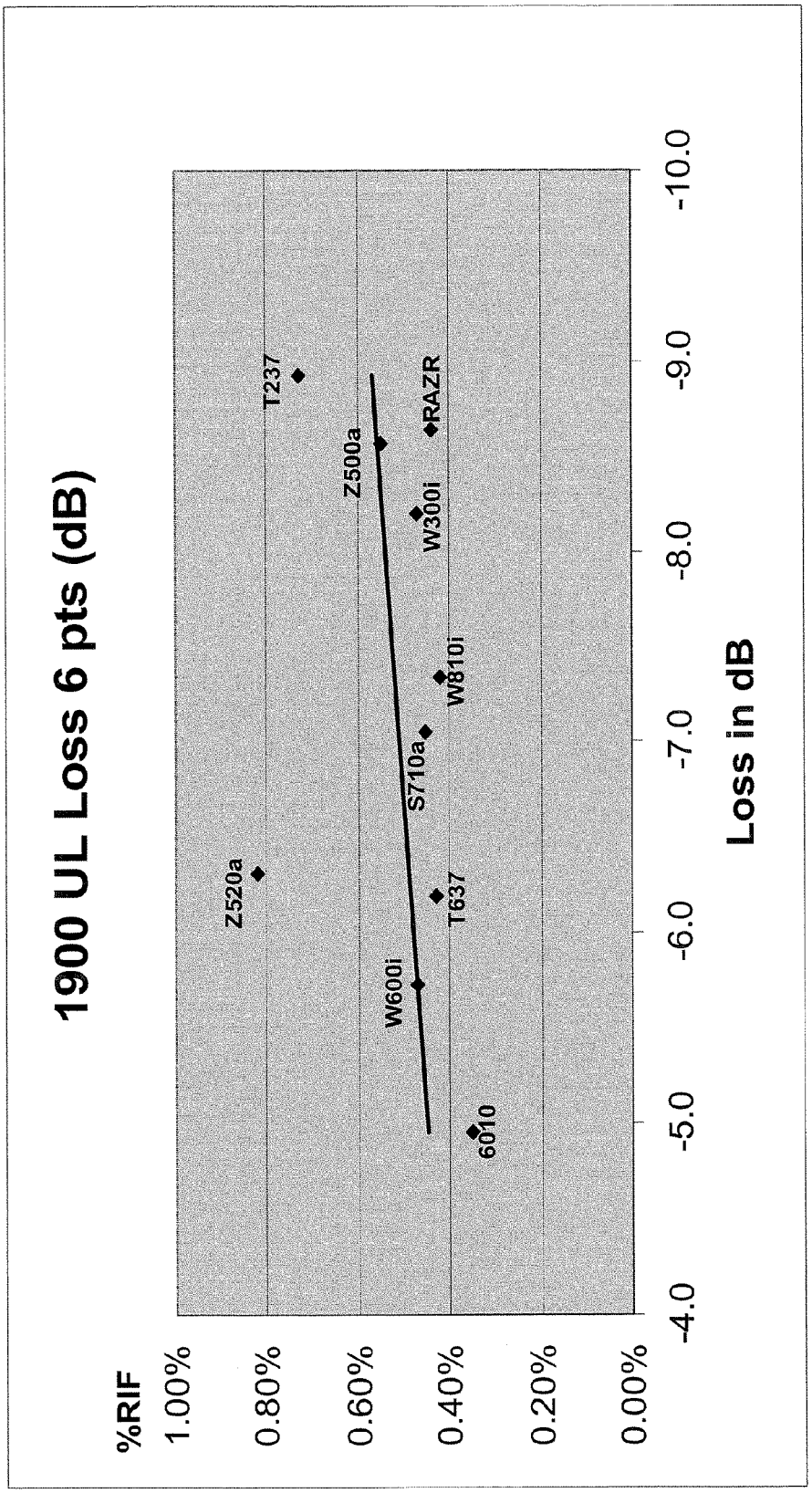

Referring now to FIG. 28, a graph illustrating Loss in dB versus % RIF for January 2007 (1900 Uplink compare) will be discussed. As illustrated in FIG. 28, 1900M UL LPA loss for 6 position has limited correlation to RIF.

Figure 29:
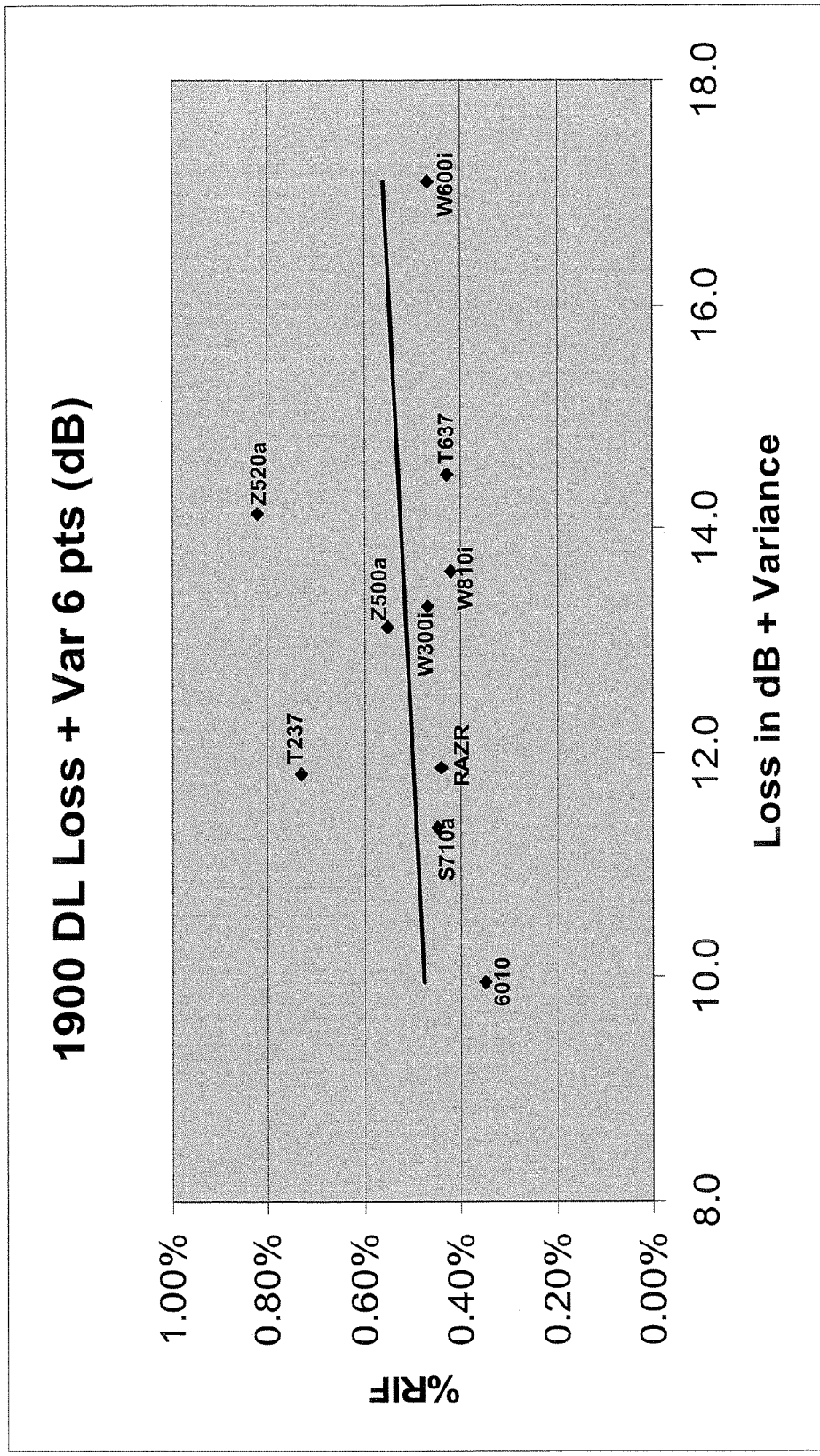

Referring now to FIG. 29, a graph illustrating Loss in dB plus variance versus % RIF for January 2007 (1900 Downlink compare) will be discussed. As illustrated in FIG. 29, 1900M DL LPA loss+6 position variance has limited correlation to RIF.

Figure 30:
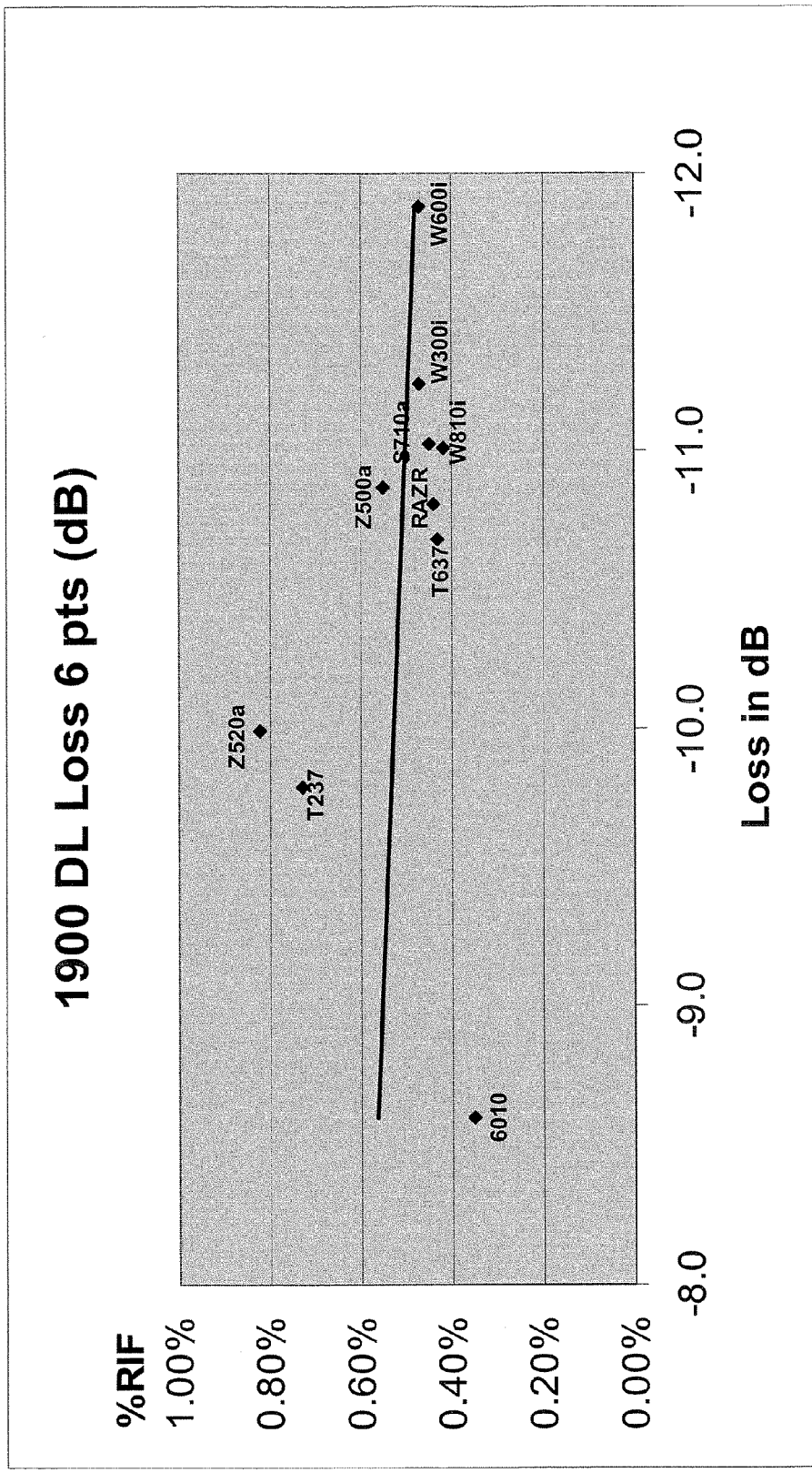

Referring now to FIG. 30, a graph illustrating Loss in dB versus % RIF for January 2007 (1900 Downlink compare) will be discussed. As illustrated in FIG. 30, 1900M DL LPA loss for 6 position has limited correlation to RIF.

FIG. 31 is a table illustrating 850M Uplink Loss+Variance versus % RIF for January 2007. To summarize the results illustrated in FIGS. 15 through 31, 850M UL LPA head/hand mean loss+6 hand positions variance shows the best RIF correlation. LPA head/hand loss at PCS UL/DL and 850M DL shows least RIF correlation. Traditional SAM TRP/TIS does not typically show good correlation.

It will be understood that the data illustrated on and discussed with respect to FIGS. 15 through 31 is provided for example purposes only and, therefore, this data does not limit embodiments of the present invention.

In the drawings and specification, there have been disclosed exemplary embodiments of the invention. However, many variations and modifications can be made to these embodiments without substantially departing from the principles of the present invention. Accordingly, although specific terms are used, they are used in a generic and descriptive sense only and not for purposes of limitation, the scope of the invention being defined by the following claims.

That which is claimed:

1. A link performance analysis (LPA) system for multi-path radio frequency (RF) testing, comprising:
    a shielded chamber;
    an antenna positioned in the chamber;
    a rotating turntable positioned in the chamber and spaced apart from the antenna;
    a rotating screen positioned in the chamber between the antenna and the rotating turntable; and
    a plurality of stationary screens spaced apart from and surrounding the rotating turntable.

2. The system of claim 1, wherein the chamber comprises a quasi-anechoic screen room having dimensions of at least about 16 feet by about 24 feet.

3. The system of claim 2, wherein the antenna and the rotating turntable are positioned about 3 meters apart and wherein the rotating screen is positioned half way between the antenna and the rotating turntable.

4. The system of claim 1, wherein the testing is performed using circular polarization wherein the antenna comprises a dual polarity wideband horn antenna that enables the circular polarization.

5. The system of claim 1, wherein the rotating turntable is configured to receive at least one portable electronic devices and to rotate in a circle during a test.

6. The system of claim 1, wherein the rotating turntable is configured to receive a simulated head, a simulated hand and/or at least one portable electronic device and to rotate in a circle during a test.

7. The system of claim 6, wherein the rotating turntable is configured to receive at least the simulated hand having one of eight hand positions.

8. The system of claim 1, wherein the rotating screen is configured to fade a signal passing through space between the antenna and the rotating turntable.

9. The system of claim 1, further comprising a set of stationary corner reflector screens behind the rotating turntable opposite the antenna, the set of stationary corner reflector screens being positioned at a 45 degree angle from the wall and configured to reflect signals produced by the system at the rotating turntable.

10. The system of claim 1, wherein the stationary reflector screens comprise eight stationary reflector screens that surround the turntable and are configured to force multipath conditions in the chamber during a test.

11. The system of claim 1, wherein the LPA system is coupled to base stations in a live wireless network during a test.

* * * * *